(12) United States Patent
Yuan et al.

(10) Patent No.: US 12,211,448 B2
(45) Date of Patent: Jan. 28, 2025

(54) DISPLAY PANEL AND DISPLAY DEVICE

(71) Applicants: Hefei BOE Joint Technology Co.,Ltd., Anhui (CN); BOE TECHNOLOGY GROUP CO., LTD., Beijing (CN)

(72) Inventors: Zhidong Yuan, Beijing (CN); Pan Xu, Beijing (CN); Yongqian Li, Beijing (CN); Can Yuan, Beijing (CN); Zhongyuan Wu, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/779,164

(22) PCT Filed: Mar. 29, 2021

(86) PCT No.: PCT/CN2021/083640
§ 371 (c)(1),
(2) Date: May 24, 2022

(87) PCT Pub. No.: WO2022/204887
PCT Pub. Date: Oct. 6, 2022

(65) Prior Publication Data
US 2024/0169925 A1    May 23, 2024

(51) Int. Cl.
*G11C 19/00*    (2006.01)
*G09G 3/32*    (2016.01)
(Continued)

(52) U.S. Cl.
CPC ............. *G09G 3/3266* (2013.01); *G09G 3/32* (2013.01); *G11C 19/287* (2013.01);
(Continued)

(58) Field of Classification Search
CPC ................... G09G 3/3266; G09G 3/32; G09G 2310/0426; G09G 2310/0286; G11C 19/28; G11C 19/287
See application file for complete search history.

(56) References Cited

U.S. PATENT DOCUMENTS

| 2006/0056267 A1* | 3/2006 | Kim ..................... G09G 3/3677 365/230.06 |
| 2011/0085635 A1* | 4/2011 | Koyama ............. H01L 27/1225 377/78 |

(Continued)

FOREIGN PATENT DOCUMENTS

| CN | 109272921 A | 1/2019 |
| CN | 209729473 U | 12/2019 |

(Continued)

OTHER PUBLICATIONS

PCT International Search Report (with English translation) and Written Opinion for corresponding PCT Application No. PCT/CN2021/083640, mailed Dec. 31, 2021, 10 pages.

*Primary Examiner* — Tuan T Lam
(74) *Attorney, Agent, or Firm* — Dority & Manning, P.A.

(57) ABSTRACT

A display panel includes sub-pixels and a scan driving circuit. The scan driving circuit includes a plurality of stages of shift registers including at least one first shift register and at least one second shift register, and a plurality of clock signal lines including at least one first sub-clock signal line and at least one second sub-clock signal line. Each shift register includes a first sub-circuit and a second sub-circuit. A first sub-clock signal line in the at least one first sub-clock signal line is electrically connected to a first sub-circuit in a first shift register in the at least one first shift register. A second sub-clock signal line in the at least one second sub-clock signal line is electrically connected to one sub- (Continued)

circuit of a first sub-circuit and a second sub-circuit in a second shift register in the at least one second shift register.

20 Claims, 11 Drawing Sheets

(51) Int. Cl.
*G09G 3/3266* (2016.01)
*G11C 19/28* (2006.01)
(52) U.S. Cl.
CPC ........... *G09G 2300/0426* (2013.01); *G09G 2310/0267* (2013.01); *G09G 2310/0286* (2013.01); *G11C 19/28* (2013.01)

(56) References Cited

U.S. PATENT DOCUMENTS

| | | | |
|---|---|---|---|
| 2012/0134460 | A1 | 5/2012 | Chen et al. |
| 2013/0265616 | A1* | 10/2013 | Okada ................. G06F 3/04184 |
| | | | 358/406 |
| 2015/0255171 | A1 | 9/2015 | Nishi et al. |
| 2016/0260365 | A1* | 9/2016 | Yang ........................ G09G 3/20 |
| 2017/0047034 | A1* | 2/2017 | Nishiyama ........... G09G 3/3688 |
| 2018/0047329 | A1 | 2/2018 | Shang et al. |
| 2018/0048329 | A1* | 2/2018 | Ha .................... H03M 13/3707 |
| 2019/0121213 | A1* | 4/2019 | Noma ....................... G09F 9/00 |
| 2021/0114941 | A1* | 4/2021 | Lenz ..................... C04B 35/453 |
| 2021/0201804 | A1* | 7/2021 | Bhanu .................. C07D 401/04 |
| | | | 544/360 |
| 2022/0114941 | A1 | 4/2022 | Gan et al. |

FOREIGN PATENT DOCUMENTS

| | | |
|---|---|---|
| CN | 111679520 A | 9/2020 |
| JP | 2005108368 A | 4/2005 |
| KR | 20070070446 A | 7/2007 |
| KR | 20150030533 A | 3/2015 |

* cited by examiner

DISPLAY PANEL AND DISPLAY DEVICE

CROSS-REFERENCE TO RELATED APPLICATION

This application is a national phase entry under 35 USC 371 of International Patent Application No. PCT/CN 2021/083640 filed on Mar. 29, 2021, which is incorporated herein by reference in its entirety.

TECHNICAL FIELD

The present disclosure relates to the field of display technologies, and in particular, to a display panel and a display device.

BACKGROUND

A scan driving circuit is an important component of a display device. The scan driving circuit may include a plurality of shift registers that are cascaded, and each stage of shift register may be electrically connected to a line in the display device. The scan driving circuit may input scan signals to a plurality of lines (e.g., gate lines or enable signal lines) in the display device row by row, so that the display device is able to display images.

The scan driving circuit is provided in the display device, which is able to effectively reduce a cost and improve a yield.

SUMMARY

In an aspect, a display panel is provided. The display panel has a display area. The display panel includes a plurality of sub-pixels located in the display area and a scan driving circuit. The plurality of sub-pixels are arranged in a plurality of rows in a second direction and arranged in a plurality of columns in a first direction. The display area includes first gap regions each located between two adjacent columns of sub-pixels. The scan driving circuit includes a plurality of stages of shift registers and a plurality of clock signal lines that are all located in the display area. The plurality of stages of shift registers include at least one first shift register and at least one second shift register, and the plurality of clock signal lines include at least one first sub-clock signal line and at least one second sub-clock signal line. Each shift register includes a first sub-circuit and a second sub-circuit. A first sub-clock signal line in the at least one first sub-clock signal line is electrically connected to a first sub-circuit in a first shift register in the at least one first shift register, and the first sub-clock signal line is located in a first gap region adjacent to the first sub-circuit in the first shift register. A second sub-clock signal line in the at least one second sub-clock signal line is electrically connected to one sub-circuit of a first sub-circuit and a second sub-circuit in a second shift register in the at least one second shift register, and the second sub-clock signal line is located in a first gap region adjacent to the one sub-circuit in the second shift register that is electrically connected to the second sub-clock signal line. The first sub-clock signal line and the second sub-clock signal line are configured to transmit a same clock signal, and the first gap region where the first sub-clock signal line is located is different from the first gap region where the second sub-clock signal line is located.

In some embodiments, the second sub-clock signal line is electrically connected to the first sub-circuit in the second shift register, and a distance between the second sub-clock signal line and the first sub-circuit in the second shift register is less than a distance between the first sub-clock signal line and the first sub-circuit in the first shift register; or the second sub-clock signal line is electrically connected to the second sub-circuit in the second shift register, a distance between the second sub-clock signal line and the second sub-circuit in the second shift register is less than a distance between the second sub-clock signal line and the first sub-circuit in the second shift register. A distance between the first sub-clock signal line and the first sub-circuit in the first shift register is less than or greater than a distance between the first sub-clock signal line and the second sub-circuit in the first shift register.

In some embodiments, in a case where the second sub-clock signal line is electrically connected to the first sub-circuit in the second shift register, the first sub-clock signal line is farther from the first sub-circuit in the first shift register and the first sub-circuit in the second shift register than the second sub-clock signal line. In a case where the second sub-clock signal line is electrically connected to the second sub-circuit in the second shift register, the first sub-clock signal line is located between the first sub-circuit in the first shift register and the second sub-circuit in the second shift register, and the second sub-clock signal line is farther from the first sub-clock signal line than the second sub-circuit in the second shift register.

In some embodiments, the plurality of clock signal lines further include at least one third sub-clock signal line and at least one fourth sub-clock signal line. A third sub-clock signal line in the at least one third sub-clock signal line is electrically connected to a second sub-circuit in the first shift register, and the third sub-clock signal line is located in a first gap region adjacent to the second sub-circuit in the first shift register. A fourth sub-clock signal line in the at least one fourth sub-clock signal line is electrically connected to another sub-circuit of the first sub-circuit and the second sub-circuit in the second shift register, and the fourth sub-clock signal line is located in a first gap region adjacent to the another sub-circuit in the second shift register that is electrically connected to the fourth sub-clock signal line. The third sub-clock signal line and the fourth sub-clock signal line are configured to transmit a same clock signal, and the first gap region where the third sub-clock signal line is located is different from the first gap region where the fourth sub-clock signal line is located.

In some embodiments, the first gap region where any one of the third sub-clock signal line and the fourth sub-clock signal line is located is different from the first gap region where any one of the first sub-clock signal line and the second sub-clock signal line is located.

In some embodiments, in a case where the second sub-clock signal line is electrically connected to the first sub-circuit in the second shift register, the fourth sub-clock signal line is electrically connected to the second sub-circuit in the second shift register, and a distance between the fourth sub-clock signal line and the second sub-circuit in the second shift register is less than a distance between the third sub-clock signal line and the second sub-circuit in the first shift register. In a case where the second sub-clock signal line is electrically connected to the second sub-circuit in the second shift register, the fourth sub-clock signal line is electrically connected to the first sub-circuit in the second shift register, a distance between the third sub-clock signal line and the second sub-circuit in the first shift register is less than a distance between the third sub-clock signal line and the first sub-circuit in the first shift register, and a distance between the fourth sub-clock signal line and the first sub-circuit in the second shift register is less than a distance between the fourth sub-clock signal line and the second sub-circuit in the second shift register.

In some embodiments, in the case where the second sub-clock signal line is electrically connected to the first sub-circuit in the second shift register, the third sub-clock signal line is farther from the second sub-circuit in the first shift register and the second sub-circuit in the second shift register than the fourth sub-clock signal line. In the case where the second sub-clock signal line is electrically connected to the second sub-circuit in the second shift register, the fourth sub-clock signal line is located between the second sub-circuit in the first shift register and the first sub-circuit in the second shift register, and the third sub-clock signal line is farther from the fourth sub-clock signal line than the second sub-circuit in the first shift register.

In some embodiments, a stage of shift register is electrically connected to a row of sub-pixels. The at least one first shift register includes a plurality of first shift registers, and the at least one second shift register includes a plurality of second shift registers. The plurality of first shift registers are electrically connected to odd-numbered rows of sub-pixels, and the plurality of second shift registers are electrically connected to even-numbered rows of sub-pixels.

In some embodiments, the scan driving circuit further includes a first bus electrically connected to the first sub-clock signal line and the second sub-clock signal line and configured to transmit the clock signal to the first sub-clock signal line and the second sub-clock signal line. In a case where the plurality of clock signal lines further include the third sub-clock signal line and the fourth sub-clock signal line, the scan driving circuit further includes a second bus electrically connected to the third sub-clock signal line and the fourth sub-clock signal line and configured to transmit the clock signal to the third sub-clock signal line and the fourth sub-clock signal line.

In some embodiments, the display panel further has a bezel area located on at least one side of the display area. The first bus is located in the bezel area and extends in the first direction, or the first bus and the second bus are located in the bezel area and extend in the first direction.

In some embodiments, in each shift register, the first sub-circuit is electrically connected to a first clock signal terminal, a pull-up node, a pull-down node and a first voltage signal terminal. The first sub-circuit is configured to: under a control of a first clock signal transmitted by the first clock signal terminal, transmit the first clock signal to the pull-down node; and control a voltage of the pull-down node under a control of a voltage of the pull-up node. The second sub-circuit is electrically connected to a second clock signal terminal, the pull-up node and an output signal terminal. The second sub-circuit is configured to transmit a second clock signal received at the second clock signal terminal to the output signal terminal under the control of the voltage of the pull-up node. The first sub-clock signal line is electrically connected to the first sub-circuit in the first shift register through a first clock signal terminal. The second sub-clock signal line is electrically connected to the first sub-circuit in the second shift register through a first clock signal terminal, or the second sub-clock signal line is electrically connected to the second sub-circuit in the second shift register through a second clock signal terminal. In a case where the plurality of clock signal lines further include the third sub-clock signal line and the fourth sub-clock signal line, the third sub-clock signal line is electrically connected to a second sub-circuit in the first shift register through a second clock signal terminal. The second sub-clock signal line is electrically connected to the first sub-circuit in the second shift register through a first clock signal terminal, and the fourth sub-clock signal line is electrically connected to the second sub-circuit in the second shift register through a second clock signal terminal; or the second sub-clock signal line is electrically connected to the second sub-circuit in the second shift register through a second clock signal terminal, and the fourth sub-clock signal line is electrically connected to the first sub-circuit in the second shift register through a first clock signal terminal.

In some embodiments, the first sub-circuit includes a first transistor and a second transistor. A control electrode of the first transistor is electrically connected to the first clock signal terminal, a first electrode of the first transistor is electrically connected to the first clock signal terminal, and a second electrode of the first transistor is electrically connected to the pull-down node. A control electrode of the second transistor is electrically connected to the pull-up node, a first electrode of the second transistor is electrically connected to the pull-down node, and a second electrode of the second transistor is electrically connected to the first voltage signal terminal. The second sub-circuit includes a third transistor and a first capacitor. A control electrode of the third transistor is electrically connected to the pull-up node, a first electrode of the third transistor is electrically connected to the second clock signal terminal, and a second electrode of the third transistor is electrically connected to the output signal terminal. A first electrode of the first capacitor is electrically connected to the pull-up node, and a second electrode of the first capacitor is electrically connected to the output signal terminal. The first sub-clock signal line is electrically connected to the first transistor in the first shift register. The second sub-clock signal line is electrically connected to the first transistor in the second shift register; or the second sub-clock signal line is electrically connected to the third transistor in the second shift register. In the case where the plurality of clock signal lines further include the third sub-clock signal line and the fourth sub-clock signal line, the third sub-clock signal line is electrically connected to the third transistor in the first shift register. The second sub-clock signal line is electrically connected to the first transistor in the second shift register, and the fourth sub-clock signal line is electrically connected to the third transistor in the second shift register; or the second sub-clock signal line is electrically connected to the third transistor in the second shift register, and the fourth sub-clock signal line is electrically connected to the first transistor in the second shift register.

In some embodiments, the first transistor includes a plurality of first sub-transistors connected in parallel; and/or the third transistor includes a plurality of third sub-transistors connected in parallel. The at least one first sub-clock signal line includes a plurality of first sub-clock signal lines, and a first sub-transistor in the first shift register is electrically connected to a first sub-clock signal line. In a case where the at least one second sub-clock signal line includes a plurality of second sub-clock signal lines, the plurality of second sub-clock signal lines are electrically connected to the first sub-circuit in the second shift register. A first sub-transistor in the second shift register is electrically connected to a second sub-clock signal line. In a case where the at least one second sub-clock signal line includes a plurality of second sub-clock signal lines, the plurality of second sub-clock signal lines are electrically connected to the second sub-circuit in the second shift register. A third sub-transistor in the second shift register is electrically connected to a second sub-clock signal line.

In some embodiments, first gap regions where the plurality of first sub-clock signal lines are located are different. First gap regions where the plurality of second sub-clock signal lines are located are different.

In some embodiments, the plurality of clock signal lines, the first electrode and the second electrode of the first transistor, the first electrode and the second electrode of the second transistor, and the first electrode and the second electrode of the third transistor are arranged in a same layer. In a case where the scan driving circuit further includes the first bus and the second bus, the first bus, the second bus, the control electrode of the first transistor, the control electrode of the second transistor, the control electrode of the third transistor and the first electrode of the first capacitor are arranged in a same layer.

In some embodiments, the display area further includes second gap regions each located between two adjacent rows of sub-pixels. The shift registers are located in the second gap regions.

In some embodiments, at least one shift register electrically connected to any two adjacent rows of sub-pixels in the second direction is located in a second gap region between the two adjacent rows of sub-pixels.

In some embodiments, each sub-pixel includes a pixel driving circuit and a light-emitting device that are arranged in the second direction. The at least one shift register includes two stages of shift registers, and in the two adjacent rows of sub-pixels, light-emitting devices are closer to the two stages of shift registers than pixel driving circuits.

In some embodiments, the shift register further includes an input circuit, a first reset circuit, a second reset circuit, a third reset circuit, a fourth reset circuit and a fifth reset circuit. The input circuit is electrically connected to an input signal terminal, a second voltage signal terminal and a pull-up node. The input circuit is configured to transmit a second voltage signal received at the second voltage signal terminal to the pull-up node in response to an input signal received at the input signal terminal. The first reset circuit is electrically connected to a pull-down node, the pull-up node and a first voltage signal terminal. The first reset circuit is configured to transmit a first voltage signal transmitted by the first voltage signal terminal to the pull-up node under a control of a voltage of the pull-down node, so as to reset the pull-up node. The second reset circuit is electrically connected to an output signal terminal, the pull-down node and the first voltage signal terminal. The second reset circuit is configured to transmit the first voltage signal transmitted by the first voltage signal terminal to the pull-down node under a control of an output signal transmitted by the output signal terminal, so as to reset the pull-down node. The third reset circuit is electrically connected to the pull-down node, the output signal terminal and the first voltage signal terminal. The third reset circuit is configured to transmit the first voltage signal transmitted by the first voltage signal terminal to the output signal terminal under the control of the voltage of the pull-down node, so as to reset the output signal terminal. The fourth reset circuit is electrically connected to a display reset signal terminal, the pull-up node and a third voltage signal terminal. The fourth reset circuit is configured to transmit a third voltage signal transmitted by the third voltage signal terminal to the pull-up node under a control of a display reset signal transmitted by the display reset signal terminal, so as to reset the pull-up node. The fifth reset circuit is electrically connected to a global reset signal terminal, the pull-up node and the first voltage signal terminal. The fifth reset circuit is configured to transmit the first voltage signal transmitted by the first voltage signal terminal to the pull-up node under a control of a global reset signal transmitted by the global reset signal terminal, so as to reset the pull-up node.

In some embodiments, the input circuit includes a fourth transistor. A control electrode of the fourth transistor is electrically connected to the input signal terminal, a first electrode of the fourth transistor is electrically connected to the second voltage signal terminal, and a second electrode of the fourth transistor is electrically connected to the pull-up node. The first reset circuit includes a fifth transistor. A control electrode of the fifth transistor is electrically connected to the pull-down node, a first electrode of the fifth transistor is electrically connected to the pull-up node, and a second electrode of the fifth transistor is electrically connected to the first voltage signal terminal. The second reset circuit includes a sixth transistor. A control electrode of the sixth transistor is electrically connected to the output signal terminal, a first electrode of the sixth transistor is electrically connected to the pull-down node, and a second electrode of the sixth transistor is electrically connected to the first voltage signal terminal. The third reset circuit includes a seventh transistor and a second capacitor. A control electrode of the seventh transistor is electrically connected to the pull-down node, a first electrode of the seventh transistor is electrically connected to the output signal terminal, and a second electrode of the seventh transistor is electrically connected to the first voltage signal terminal. A first electrode of the second capacitor is electrically connected to the pull-down node, and a second electrode of the second capacitor is electrically connected to the first voltage signal terminal. The fourth reset circuit includes an eighth transistor. A control electrode of the eighth transistor is electrically connected to the display reset signal terminal, a first electrode of the eighth transistor is electrically connected to the pull-up node, and a second electrode of the eighth transistor is electrically connected to the third voltage signal terminal. The fifth reset circuit includes a ninth transistor. A control electrode of the ninth transistor is electrically connected to the global reset signal terminal, a first electrode of the ninth transistor is electrically connected to the pull-up node, and a second electrode of the ninth transistor is electrically connected to the first voltage signal terminal.

In another aspect, a display device is provided. The display device includes the display panel in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings.

In addition, the accompanying drawings to be described below may be regarded as schematic diagrams, and are not limitations on an actual size of a product involved in the embodiments of the present disclosure.

DETAILED DESCRIPTION

Figure 1:
FIG. 1 is a structural diagram of a display device, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and extensions thereof may be used. For example, the term "connected" may be used in the description of some embodiments to indicate that two or more components are in direct physical or electrical contact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of "applicable to" or "configured to" herein means an open and inclusive expression, which does not exclude devices that are applicable to or configured to perform additional tasks or steps.

Additionally, the use of the phrase "based on" is meant to be open and inclusive, since a process, step, calculation, or other action that is "based on" one or more stated conditions or values may, in practice, be based on additional conditions or values beyond those stated.

The term such as "about" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Transistors used in circuits in the embodiments of the present disclosure may be thin film transistors, field effect transistors (e.g., oxide thin film transistors) or other switching devices with same characteristics. The thin film transistors are taken as an example for description in the embodiments of the present disclosure.

In some embodiments, a control electrode of each transistor used in a shift register is a gate of the transistor, a first electrode of the transistor is one of a source and a drain of the transistor, and a second electrode of the transistor is another one of the source and the drain of the transistor. Since a source and a drain of a transistor may be symmetrical in structure, the source and the drain of the transistor may be same in structure. That is, the first electrode and the second electrode of the transistor in the embodiments of the present disclosure may be same in structure. For example, in a case where the transistor is a P-type transistor, the first electrode of the transistor is a source, and the second electrode of the transistor is a drain. For example, in a case where the transistor is an N-type transistor, the first electrode of the transistor is a drain, and the second electrode of the transistor is a source.

In the circuits in the embodiments of the present disclosure, nodes such as a pull-up node and a pull-down node do not represent actual components, but represent junctions of related electrical connections in circuit diagrams. That is, these nodes are nodes that are equivalent to the junctions of the related electrical connections in the circuit diagrams.

In the embodiments of the present disclosure, the term "pull up" refers to charging a node or an electrode of a transistor, so that an absolute value of a voltage of the node or the electrode is increased, thereby operating (e.g., turning on) a corresponding transistor. The term "pull down" refers to discharging a node or an electrode of a transistor, so that an absolute value of a voltage of the node or the electrode is reduced, thereby operating (e.g., turning off) a corresponding transistor.

Hereinafter, the circuits in the embodiments of the present disclosure will be described in an example where the transistors are all N-type transistors.

Some embodiments of the present disclosure provide a display panel and a display device. The display panel and the display device will be introduced below.

Some embodiments of the present disclosure provide the display device 1000, as shown in FIG. 1. The display device 1000 may be any device that displays images whether moving (e.g., videos) or stationary (e.g., still images). More specifically, it is anticipated that the embodiments may be implemented in, or associated with, a variety of electronic devices. The variety of electronic devices are, for example (but not limited to), mobile phones, wireless apparatuses, personal data assistants (PDAs), hand-held or portable computers, global positioning system (GPS) receivers/navigators, cameras, MP4 video players, camcorders, game consoles, watches, clocks, calculators, television monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packagings, and aesthetic structures (e.g., a display for displaying an image of a piece of jewelry).

In some examples, the display device 1000 includes a frame, and the display panel 100, a circuit board, a display driver integrated circuit (IC) and other electronic accessories that are provided in the frame.

The display panel 100 may be, for example, an organic light-emitting diode (OLED) display panel, a quantum dot light-emitting diode (QLED) display panel, a micro light-emitting diode (Micro LED) display panel or a mini light-emitting diode (Mini LED) display panel, which is not specifically limited.

Some embodiments of the present disclosure will be schematically described below in an example where the display panel 100 is the OLED display panel.

In some examples, as shown in FIGS. 5 to 8, the display panel 100 has a display area A. Of course, the display panel 100 may further have a bezel area B. The bezel area B may be located on side(s) of the display area A.

For example, the side(s) refer to a side, two sides, three sides or a peripheral side of the display area A. That is, the bezel area B may be located on a side, two sides or three sides of the display area A, or located on the peripheral side of the display area A, i.e., around the display area A.

In some examples, as shown in FIGS. 5 to 8, the display panel 100 may include a substrate 1, a plurality of sub-pixels 2 and a scan driving circuit 3.

A type of the substrate 1 varies, and may be set according to actual needs.

For example, the substrate 1 may be a rigid substrate. The rigid substrate may be, for example, a glass substrate or a polymethyl methacrylate (PMMA) substrate.

For example, the substrate 1 may be a flexible substrate. The flexible substrate may be, for example, a polyethylene terephthalate (PET) substrate, a polyethylene naphthalate two formic acid glycol ester (PEN) substrate or a polyimide (PI) substrate. In this case, the display panel 100 may be a flexible display panel.

In some examples, as shown in FIGS. 5 to 8, the plurality of sub-pixels 2 may be disposed on a side of the substrate 1, and located in the display area A. For example, the plurality of sub-pixels 2 may be arranged in a plurality of rows in a second direction Y, and arranged in a plurality of columns in a first direction X. Each row of sub-pixels 2 may include sub-pixels 2, and each column of sub-pixels 2 may include sub-pixels 2. The number of sub-pixels 2 included in a different row of sub-pixels 2 and the number of sub-pixels 2 included in a different column of sub-pixels 2 may be set according to actual needs (e.g., a shape of the display panel 100).

Here, the first direction X and the second direction Y intersect with each other. An included angle between the first direction X and the second direction Y may be set according to actual needs. For example, the included angle between the first direction X and the second direction Y may be 85 degrees, 89 degrees or 90 degrees.

An arrangement of the plurality of sub-pixels 2 varies, and may be set according to actual needs.

Figure 7:
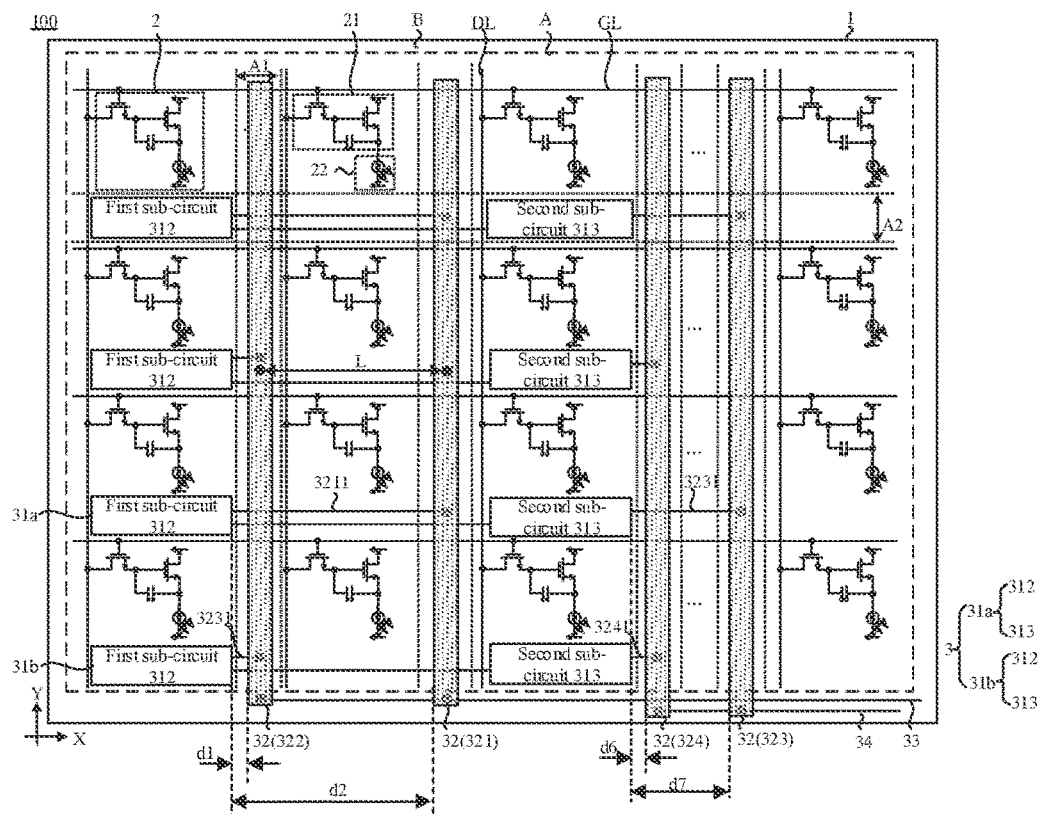
FIG. 7 is a structural diagram of yet another display panel, in accordance with some embodiments of the present disclosure.

For example, as shown in FIG. 7, the plurality of sub-pixels 2 are uniformly disposed on the side of the substrate 1. A distance between any two adjacent sub-pixels 2 is equal or approximately equal.

Figure 11A:
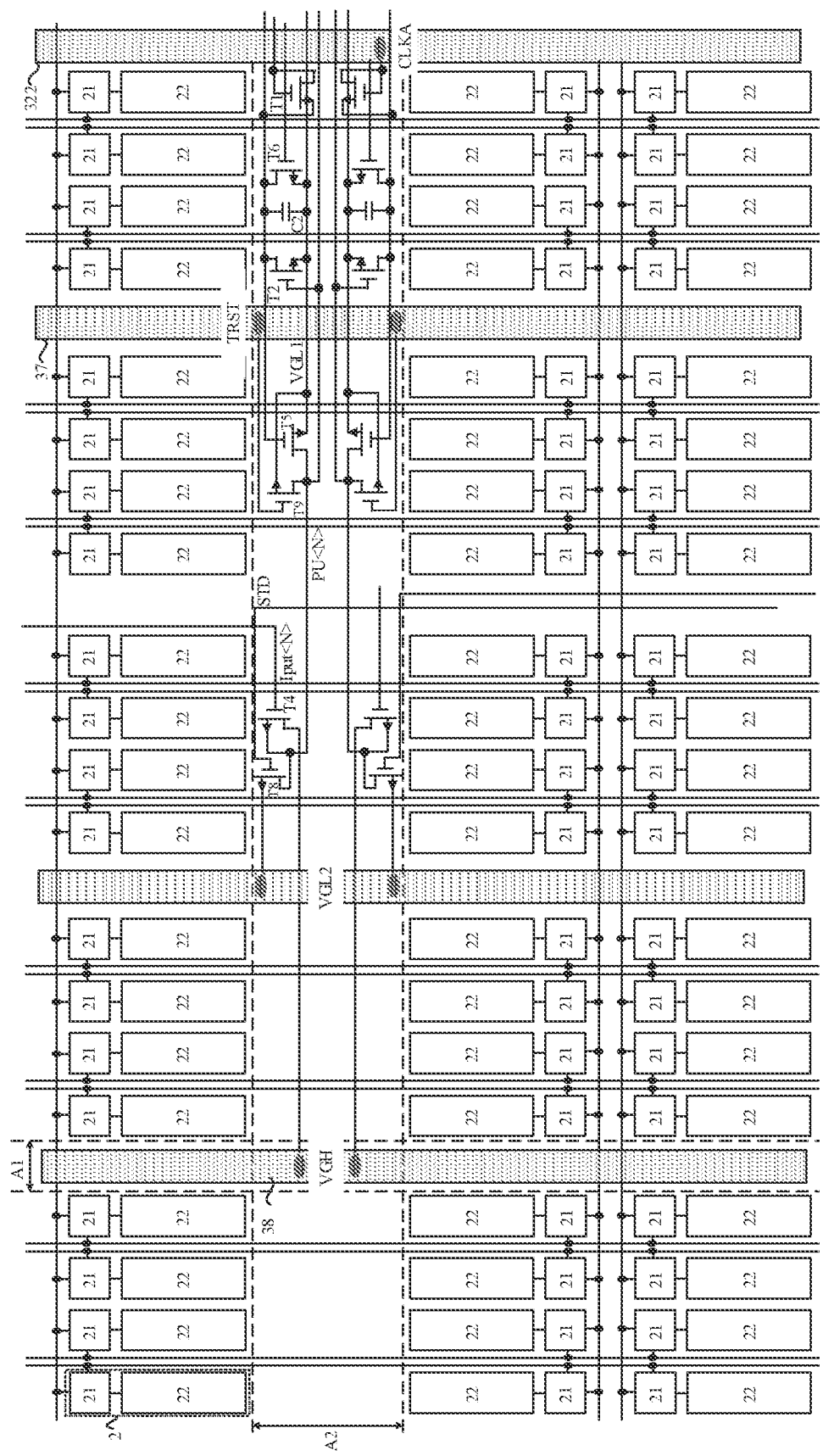
FIGS. 11a and 11b are structural diagrams of sub-pixels and a scan driving circuit, in accordance with some embodiments of the present disclosure.
Figure 11B:
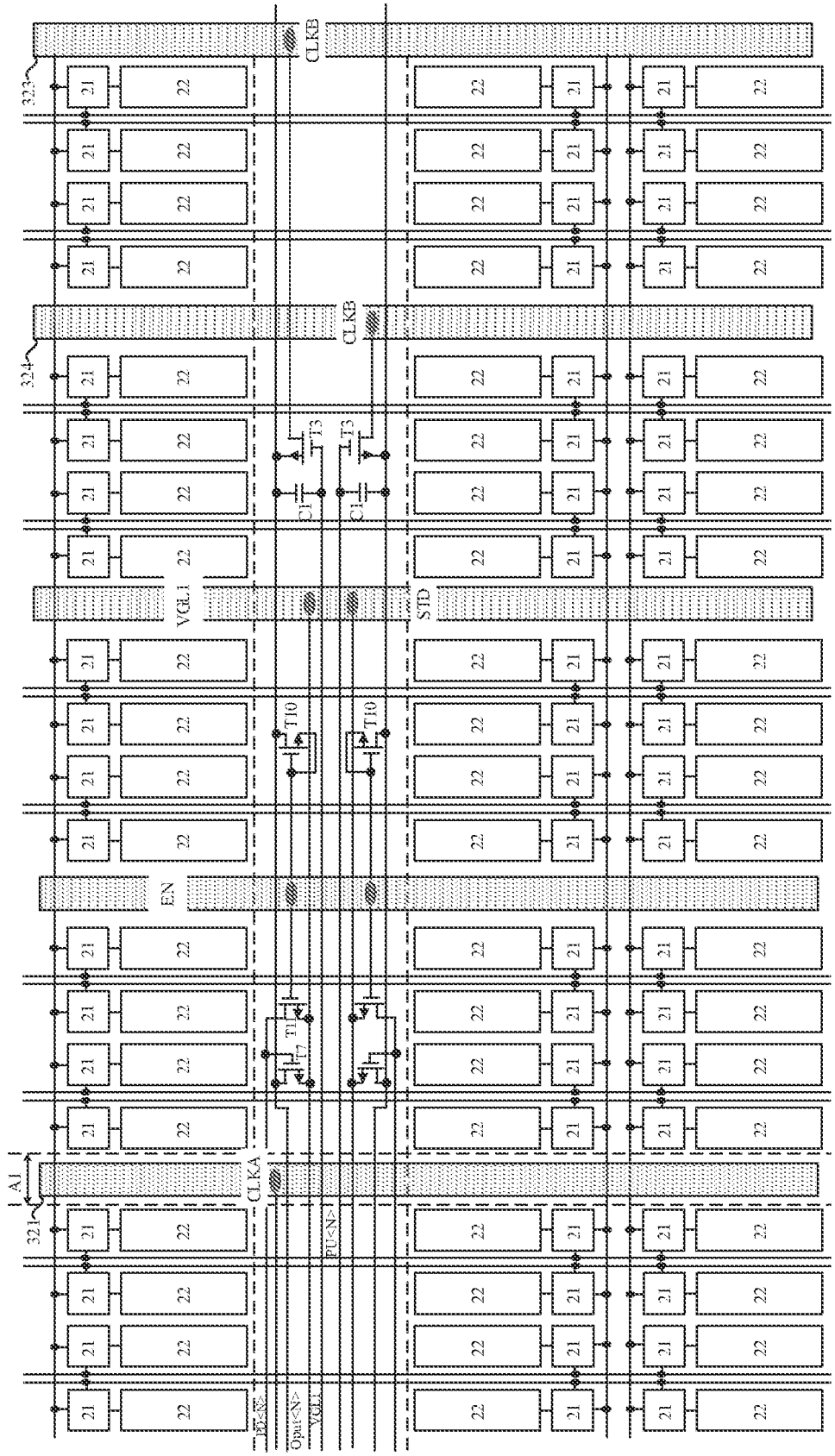

For another example, at least two sub-pixels 2 form a group of sub-pixels, and a plurality of groups of sub-pixels are arranged in rows in the second direction Y, and arranged in columns in the first direction X. As shown in FIGS. 11*a* to 11*b*, four sub-pixels 2 form a group of sub-pixels, and the four sub-pixels 2 may include, for example, a red sub-pixel, a green sub-pixel, a blue sub-pixel and a white sub-pixel.

For example, as shown in FIGS. 5 to 8, in the plurality of sub-pixels 2, each sub-pixel 2 may include a pixel driving circuit 21 and a light-emitting device 22 electrically connected to the pixel driving circuit 21. The pixel driving circuit 21 may supply a driving voltage to the light-emitting device 22 to control a light-emitting state of the light-emitting device 22.

A structure of the pixel driving circuit 21 varies, and may be set according to actual needs. For example, the pixel driving circuit 21 may include a structure such as "2T1C," "6T1C," "7T1C," "6T2C," or "7T2C". Here, "T" represents a thin film transistor, a number before "T" represents the number of thin film transistors, "C" represents a storage capacitor, and a number before "C" represents the number of storage capacitors. The pixel driving circuit 21 may include a switching transistor and a driving transistor.

For example, the light-emitting device 22 may include an anode, a light-emitting layer and a cathode that are sequentially stacked. In addition, the light-emitting device 22 may further include, for example, a hole injection layer and/or a hole transporting layer disposed between the anode and the light-emitting layer. The light-emitting device 22 may further include, for example, an electron transporting layer and/or an electron injection layer disposed between the light-emitting layer and the cathode. The pixel driving circuit 21 may be, for example, electrically connected to the anode of the light-emitting device 22.

For example, at least one of the anode and the cathode is a light-transmitting layer. That is, at least one of the anode and the cathode may be made of a conductive material with a high light transmittance.

For example, the conductive material with a high light transmittance may be indium tin oxide (ITO).

In a case where the anode is a light-transmitting layer, light emitted from the light-emitting device 22 may exit in a direction towards the substrate 1, and in this case, the display panel 100 may be a bottom-emitting display panel. In a case where the cathode is a light-transmitting layer, the light emitted from the light-emitting device 22 may exit in a direction away from the substrate 1, and in this case, the display panel 100 may be a top-emitting display panel. In a case where the anode and the cathode are light-transmitting layers, the display panel 100 may emit light from both sides.

In addition, in a case where the display panel 100 is the bottom-emitting display panel, the pixel driving circuit 21 and the light-emitting device 22 may have a positional relationship as shown in FIGS. 11a and 11b. An orthographic projection of the pixel driving circuit 21 on the substrate 1 is non-overlapped with an orthographic projection of the light-emitting device 22 on the substrate 1 to ensure a high light transmittance of the display panel 100. Of course, in a case where the display panel 100 has a high light transmittance, the orthographic projection of the pixel driving circuit 21 on the substrate 1 may be partially overlapped with the orthographic projection of the light-emitting device 22 on the substrate 1, which is beneficial to improving a pixel density (also called pixels per inch, PPI) of the display panel 100.

In a case where the display panel 100 is the top-emitting display panel, the orthographic projection of the pixel driving circuit 21 on the substrate 1 may be partially overlapped with the orthographic projection of the light-emitting device 22 on the substrate 1, which is beneficial to reducing an occupied area of the sub-pixel 2 on the substrate 1 to improve the PPI of the display panel 100.

In some examples, as shown in FIGS. 5 to 8, the display panel 100 may further include a plurality of gate lines GL disposed on a side of the substrate 1 and extending in the first direction X, and a plurality of data lines DL disposed on a side of the substrate 1 and extending in the second direction Y. For example, the plurality of data lines DL are located on a side of the plurality of gate lines GL away from the substrate 1, and the plurality of data lines DL are insulated from the plurality of gate lines GL.

For example, as shown in FIGS. 5 to 8, a gate line GL may be electrically connected to pixel driving circuits 21 in a same row of sub-pixels 2, and a data line DL may be electrically connected to pixel driving circuits 21 in a same column of sub-pixels 2. The number of gate lines GL electrically connected to pixel driving circuits 21 in a same row of sub-pixels 2 may be set according to the structure of the pixel driving circuit 21. A schematic description will be made in an example where sub-pixels 2 in a same row are electrically connected to a gate line GL.

Of course, for example, the display panel 100 may further include a plurality of enable signal lines disposed on a side of the substrate 1 and extending in the first direction X. For example, the plurality of enable signal lines and the plurality of gate lines GL may be arranged in a same layer. Alternatively, the plurality of enable signal lines may be located in different layers from the plurality of gate lines GL, and insulated from the plurality of gate lines GL.

For example, an enable signal line may be electrically connected to pixel driving circuits 21 in sub-pixels 2 in a same row. An arrangement of the enable signal line may be set according to the structure of the pixel driving circuit.

In a display process of the display panel 100, the pixel driving circuit 21 may receive a scan signal from a corresponding gate line GL and a data signal from a corresponding data line DL to form the driving voltage and transmit the driving voltage to the light-emitting device 22, so as to drive the light-emitting device 22 to emit light. Alternatively, the pixel driving circuit 21 may receive a scan signal from a corresponding gate line GL, a data signal from a corresponding data line DL and an enable signal from a corresponding enable signal line to form the driving voltage and transmit the driving voltage to the light-emitting device 22, so as to drive the light-emitting device 22 to emit light. The light-emitting devices 22 in the plurality of sub-pixels cooperate to enable the display panel 100 to display images.

In some examples, the scan driving circuit 3 and the plurality of sub-pixels 2 are located on the same side of the substrate 1. The scan driving circuit 3 may include a plurality of stages of shift registers 31. The plurality of stages of shift registers 31 may be cascaded.

A structure of the scan driving circuit 3 varies, and may be set according to actual needs.

For example, the scan driving circuit 3 may be a light-emitting control circuit. In a case where the pixel driving circuit 21 is further electrically connected to an enable signal line, the light-emitting control circuit may be electrically connected to the plurality of enable signal lines, so as to supply enable signals to corresponding pixel driving circuits 21 through the plurality of enable signal lines.

For example, the scan driving circuit 3 may be a gate driving circuit. The gate driving circuit may be electrically connected to the plurality of gate lines GL, so as to supply scan signals to corresponding pixel driving circuits 21 through the plurality of gate lines GL.

Hereinafter, a schematic description will be made in an example where the scan driving circuit 3 is the gate driving circuit, and the pixel driving circuit 21 has the "2T1C" structure as shown in FIGS. 5 to 8.

In some examples, the number of the plurality of stages of shift registers 31 included in the scan driving circuit 3 and the number of rows of the sub-pixels 2 may be equal or unequal.

For example, as shown in FIGS. 5 to 8, and FIGS. 11a and 11b, the number of shift registers 31 may be equal to the number of rows of the sub-pixels 2. Based on this, a stage of shift register 31 may be electrically connected to pixel driving circuits 21 in a same row of sub-pixels 2 through a gate line GL. In the display process of the display panel 100, each stage of shift register 31 in the scan driving circuit 3 may transmit the scan signal to pixel driving circuits 21 in a corresponding row of sub-pixels 2 through a corresponding gate line GL. The structures shown in FIGS. 11a and 11b are connected in sequence, and it is difficult to show the structures in a figure, and thus the structures are divided into the figures, respectively.

For example, the number of shift registers 31 may be greater than the number of rows of the sub-pixels 2. Based on this, a stage of shift register 31 may be electrically connected to pixel driving circuits 21 in a same row of sub-pixels 2 through a gate line GL. Output signal terminal(s) Oput<N> in other stage(s) of shift register(s) 31 not electrically connected to the gate lines GL may be in a floating state. A description of an output signal terminal Oput<N> may refer to following description, and will not be repeated here.

For example, the number of shift registers 31 may be less than the number of rows of the sub-pixels 2. Based on this, a stage of shift register 31 may be electrically connected to sub-pixels 2 in rows. A stage of shift register 31 may be electrically connected to pixel driving circuits 21 in sub-pixels 2 in corresponding rows through gate lines GL. In the display process of the display panel 100, each stage of shift registers 31 in the scan driving circuit 3 may transmit scan signals to pixel driving circuits 21 in sub-pixels 2 in corresponding rows through corresponding gate lines GL. In this case, output signal terminal(s) Oput<N> in part of the shift registers 31 may also be in a floating state.

A structure of the shift register 31 varies, and may be set according to actual needs. Hereinafter, the structure of the shift register 31 will be schematically described, but the structure of the shift register 31 is not limited to the exemplified structure.

For example, a first voltage signal terminal VGL1 is configured to transmit a direct current low level signal (e.g., lower than or equal to a low level section of a clock signal). Here, this direct current low level signal is referred to as a first voltage signal. A second voltage signal terminal VGH is configured to transmit a direct current high level signal (e.g., higher than or equal to a high level section of a clock signal). Here, the direct current high level signal is referred to as a second voltage signal. A third voltage signal terminal VGL2 is configured to transmit a direct current low level signal (e.g., lower than or equal to a low level section of a clock signal). Here, the direct current low level signal is referred to as a third voltage signal. Voltage signal terminals in following embodiments are the same as the above, and will not be repeated.

For example, a voltage value of the second voltage signal is greater than a voltage value of the first voltage signal, and is greater than a voltage value of the third voltage signal. The voltage value of the first voltage signal and the voltage value of the third voltage signal may be equal or unequal.

Figure 9A:
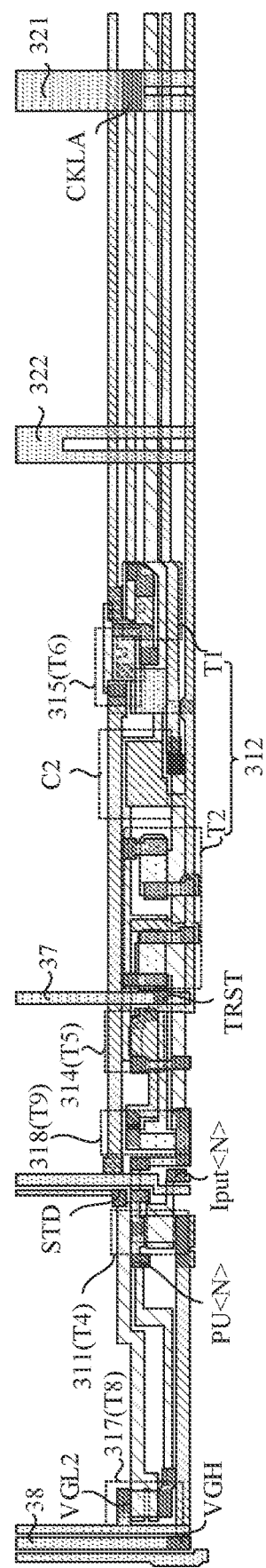
FIGS. 9a to 9c are structural diagrams of a scan driving circuit, in accordance with some embodiments of the present disclosure.
Figure 9B:
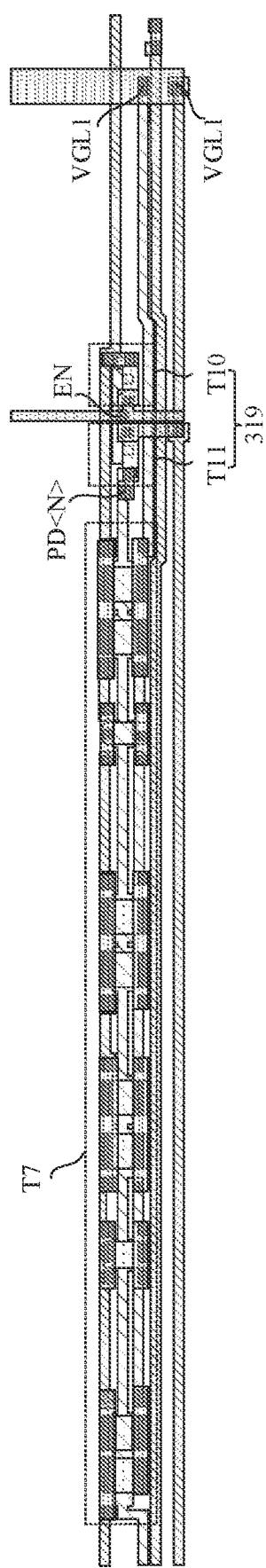
Figure 9C:
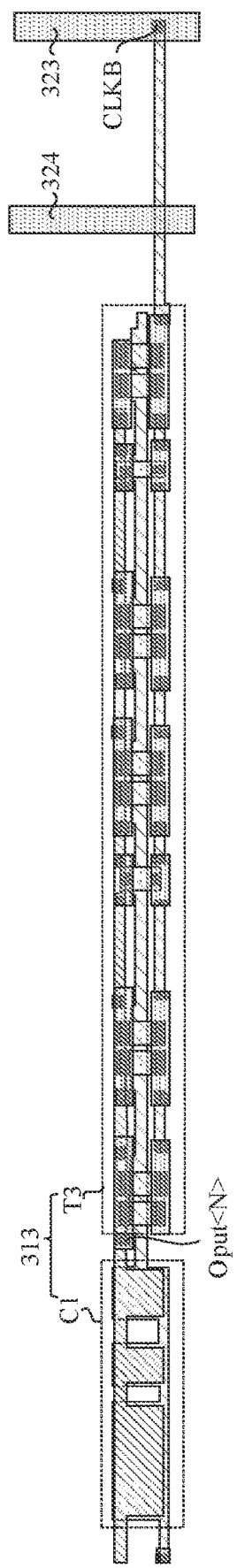

In some examples, as shown in FIGS. 2 to 4 and FIGS. 9a to 9c, the shift register 31 may include an input circuit 311, a first sub-circuit 312 (also referred to as a control circuit) and a second sub-circuit 313 (also referred to as an output circuit). The structures shown in FIGS. 9a to 9c are connected in sequence, and it is difficult to show the structures in a figure, and thus the structures are divided into the figures, respectively.

Figure 2:
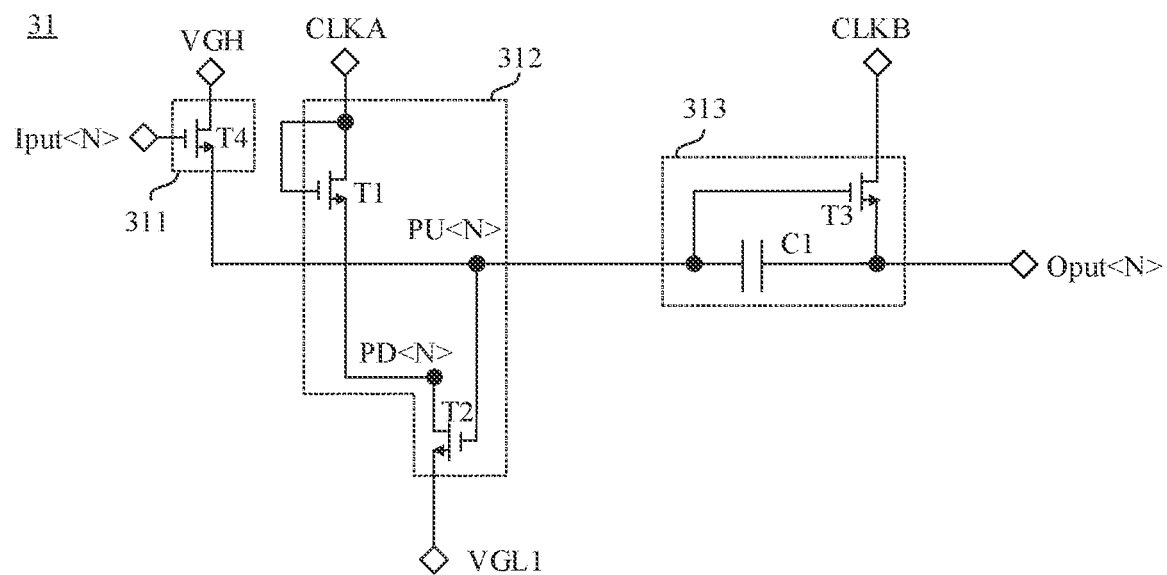
FIG. 2 is a circuit diagram of a shift register, in accordance with some embodiments of the present disclosure.
Figure 3:
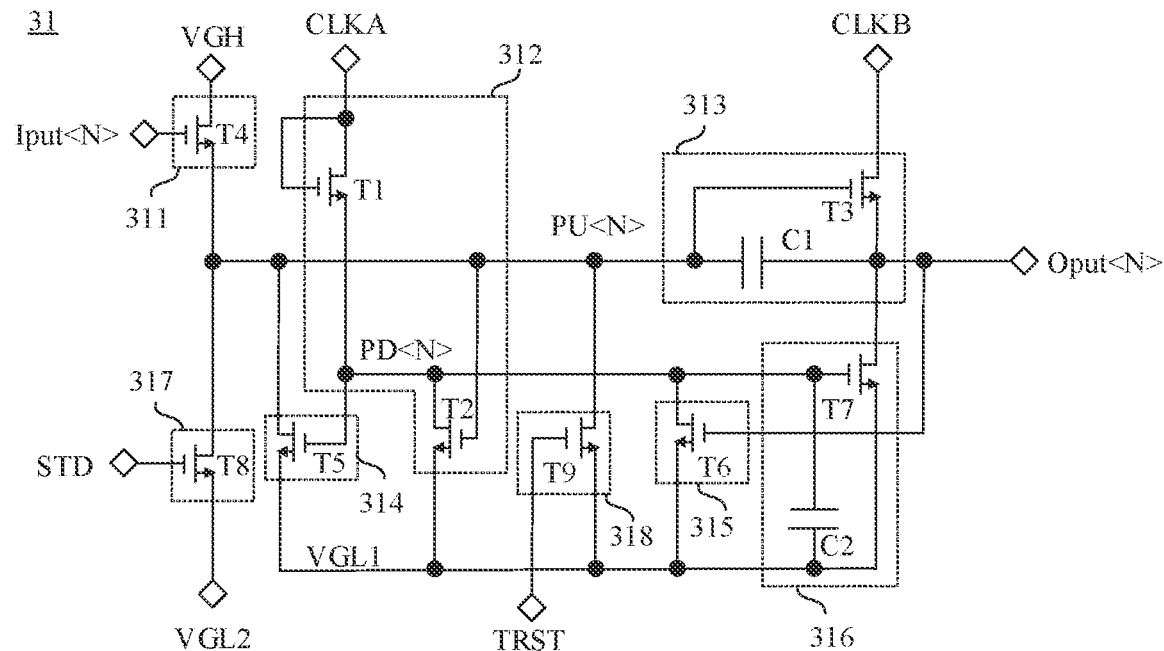
FIG. 3 is a circuit diagram of another shift register, in accordance with some embodiments of the present disclosure.
Figure 4:
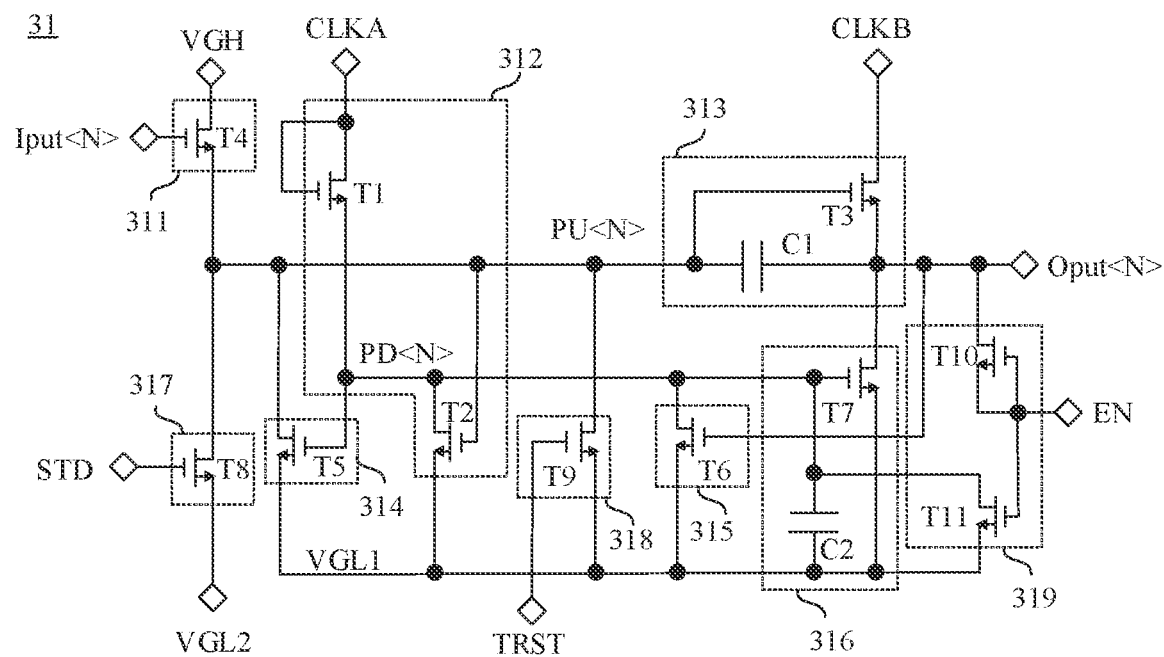
FIG. 4 is a circuit diagram of yet another shift register, in accordance with some embodiments of the present disclosure.

For example, as shown in FIGS. 2 to 4, the input circuit 311 is electrically connected to an input signal terminal Input<N> (i.e., Iput<N> in the drawings and in the following), the second voltage signal terminal VGH and a pull-up node PU<N>. The input circuit 311 is configured to transmit the second voltage signal received at the second voltage signal terminal VGH to the pull-up node PU<N> in response to an input signal received at the input signal terminal Iput<N>. Here, N is a positive integer that represents a row number of sub-pixels.

For example, in a case where a level of the input signal is a high level, the input circuit 311 may be turned on due to an action of the input signal to transmit the second voltage signal received at the second voltage signal terminal VGH to the pull-up node PU<N>, so as to charge the pull-up node PU<N>, so that a voltage of the pull-up node PU<N> is increased.

As shown in FIGS. 2 to 4, the input circuit 311 includes a fourth transistor T4.

For example, as shown in FIGS. 3 and 4, a control electrode of the fourth transistor T4 is electrically connected to the input signal terminal Iput<N>, a first electrode of the fourth transistor T4 is electrically connected to the second voltage signal terminal VGH, and a second electrode of the fourth transistor T4 is electrically connected to the pull-up node PU<N>.

Here, in the case where the level of the input signal is a high level, the fourth transistor T4 is turned on due to the action of the input signal. The fourth transistor T4 may receive the second voltage signal transmitted by the second voltage signal terminal VGH and transmit the received second voltage signal to the pull-up node PU<N>, so that the voltage of the pull-up node PU<N> is increased.

For example, as shown in FIGS. 2 to 4, the first sub-circuit 312 is electrically connected to a first clock signal terminal CLKA, the pull-up node PU<N>, a pull-down node PD<N> and the first voltage signal terminal VGL1. The first sub-circuit 312 is configured to: under a control of a first clock signal transmitted by the first clock signal terminal CLKA, transmit the first clock signal to the pull-down node PD<N>; and control a voltage of the pull-down node PD<N> under a control of the voltage of the pull-up node PU<N>.

For example, in a case where a level of the first clock signal is a high level, the first sub-circuit 312 may be turned on due to an action of the first clock signal to transmit the first clock signal received at the first clock signal terminal CLKA to the pull-down node PD<N>, so as to charge the pull-down node PD<N>, so that the voltage of the pull-down node PD<N> is increased. In a case where the voltage of the pull-up node PU<N> is at a high level, the first sub-circuit 312 may transmit the first voltage signal transmitted by the first voltage signal terminal VGL1 to the pull-down node PD<N>, so as to pull down the voltage of the pull-down node PD<N>. In a case where the voltage of the pull-up node PU<N> is at a low level, the first sub-circuit 312 may not transmit the first voltage signal to the pull-down node PD<N>, so that the voltage of the pull-down node PD<N> is maintained at a high level.

As shown in FIGS. 2 to 4, the first sub-circuit 312 includes a first transistor T1 and a second transistor T2.

For example, as shown in FIGS. 2 to 4, a control electrode of the first transistor T1 is electrically connected to the first clock signal terminal CLKA, a first electrode of the first transistor T1 is electrically connected to the first clock signal terminal CLKA, and a second electrode of the first transistor T1 is electrically connected to the pull-down node PD<N>. A control electrode of the second transistor T2 is electrically connected to the pull-up node PU<N>, a first electrode of the second transistor T2 is electrically connected to the pull-down node PD<N>, and a second electrode of the second transistor T2 is electrically connected to the first voltage signal terminal VGL1.

Here, in the case where the level of the first clock signal is a high level, the first transistor T1 may be turned on due to the action of the first clock signal to transmit the first clock signal received at the first clock signal terminal CLKA to the pull-down node PD<N>, so as to charge the pull-down node PD<N>, so that the voltage of the pull-down node PD<N> is increased. In a case where the input circuit 311 is turned on such that the voltage of the pull-up node PU<N> is at a high level, the second transistor T2 may be turned on due to an action of the pull-up node PU<N>, so that the second transistor T2 may receive the first voltage signal transmitted by the first voltage signal terminal VGL1 and transmit the received first voltage signal to the pull-down node PD<N>, so as to pull down the voltage of the pull-down node PD<N>. In the case where the voltage of the pull-up node PU<N> is at a low level, the second transistor T2 may be turned off due to the action of the pull-up node PU<N>, so that the voltage of the pull-down node PD<N> is maintained at a high level.

For example, as shown in FIGS. 2 to 4, the second sub-circuit 313 is electrically connected to a second clock signal terminal CLKB, the pull-up node PU<N> and the output signal terminal Output<N> (i.e., Oput<N> in the drawings and in the following). The second sub-circuit 313 is configured to transmit a second clock signal received at the second clock signal terminal CLKB to the output signal terminal Oput<N> under the control of the voltage of the pull-up node PU<N>.

For example, in the case where the input circuit 311 is turned on such that the voltage of the pull-up node PU<N> is at a high level, the second sub-circuit 313 may be turned on under the control of the voltage of the pull-up node PU<N> to output the second clock signal received at the second clock signal terminal CLKB as an output signal from the output signal terminal Oput<N>.

In these examples, an output signal terminal Oput<N> in a stage of shift register 31 may be electrically connected to at least one gate line GL, and an output signal output from the output signal terminal Oput<N> may be used as the scan signal, and transmitted to pixel driving circuits 21 in corresponding at least one row of sub-pixels 2 through the at least one gate line GL.

As shown in FIGS. 2 to 4, the second sub-circuit 313 includes a third transistor T3 and a first capacitor C1.

For example, as shown in FIGS. 2 to 4, a control electrode of the third transistor T3 is electrically connected to the pull-up node PU<N>, a first electrode of the third transistor T3 is electrically connected to the second clock signal terminal CLKB, and a second electrode of the third transistor T3 is electrically connected to the output signal terminal Oput<N>. A first electrode of the first capacitor C1 is electrically connected to the pull-up node PU<N>, and a second electrode of the first capacitor C1 is electrically connected to the output signal terminal Oput<N>.

Here, in the case where the input circuit 311 is turned on such that the voltage of the pull-up node PU<N> is at a high level, the third transistor T3 may be turned on under the control of the voltage of the pull-up node PU<N>. The third transistor T3 may receive the second clock signal transmitted by the second clock signal terminal CLKB, and output the second clock signal as the output signal from the output signal terminal Oput<N>.

In addition, when the input circuit 311 is turned on such that the voltage of the pull-up node PU<N> is increased, the first capacitor C1 is also charged. In a case where the input circuit 311 is turned off, the first capacitor C1 may be discharged, so that the pull-up node PU<N> is maintained at a high level, and thus the third transistor T3 may be maintained in an on state. The third transistor T3 may continuously receive the second clock signal and continuously output the output signal from the output signal terminal Oput<N>.

It will be noted that after the plurality of stages of shift registers 31 are cascaded to form the scan driving circuit 3, an output signal terminal Oput<N> in a certain stage of shift register 31 may be, for example, electrically connected to an input signal terminal Iput<N> in a next stage of shift register 31. In this way, an output signal output from the output signal terminal Oput<N> in this stage of shift register 31 may be used as an input signal of the next stage of shift register 31. Of course, the cascade relationship of the plurality of stages of shift registers 21 is not limited thereto.

Input signal terminal(s) Iput<N> in part of the shift registers 31 may be electrically connected to an initial signal line 35, so as to receive an initial signal transmitted by the initial signal line 35 as the input signal. A description of the initial signal line 35 may refer to the following description, and will not be repeated here.

The number of shift registers 31 electrically connected to the initial signal line 35 is not limited, and may be set according to actual needs.

For example, the part of the shift registers 31 electrically connected to the initial signal line 35 may be, for example, a first stage shift register 31 in the scan driving circuit 3, or the first stage shift register 31 and a second stage shift register 31.

In some examples, as shown in FIGS. 3 and 4, the shift register 31 may further include a first reset circuit 314, a second reset circuit 315, a third reset circuit 316, a fourth reset circuit 317 and a fifth reset circuit 318.

For example, as shown in FIGS. 3 and 4, the first reset circuit 314 is electrically connected to the pull-down node PD<N>, the pull-up node PU<N> and the first voltage signal terminal VGL1. The first reset circuit 314 is configured to reset the pull-up node PU<N> under a control of the voltage of the pull-down node PD<N>.

For example, in a case where the voltage of the pull-down node PD<N> is at a high level, the first reset circuit 314 may be turned on due to an action of the voltage of the pull-down node PD<N>. The first reset circuit 314 may receive the first voltage signal transmitted by the first voltage signal terminal VGL1, and transmit the first voltage signal to the pull-up node PU<N>, so as to pull down and reset the pull-up node PU<N>.

As shown in FIGS. 3 and 4, the first reset circuit 314 includes a fifth transistor T5.

For example, as shown in FIGS. 3 and 4, a control electrode of the fifth transistor T5 is electrically connected to the pull-down node PD<N>, a first electrode of the fifth transistor T5 is electrically connected to the pull-up node PU<N>, and a second electrode of the fifth transistor T5 is electrically connected to the first voltage signal terminal VGL1.

Here, in the case where the voltage of the pull-down node PD<N> is at a high level, the fifth transistor T5 may be turned on under the control of the voltage of the pull-down node PD<N>. The fifth transistor T5 may transmit the first voltage signal transmitted by the first voltage signal terminal VGL1 to the pull-up node PU<N> to pull down the voltage of the pull-up node PU<N>, so as to reset the pull-up node PU<N>.

For example, as shown in FIGS. 3 and 4, the second reset circuit 315 is electrically connected to the output signal terminal Oput<N>, the pull-down node PD<N> and the first voltage signal terminal VGL1. The second reset circuit 315 is configured to reset the pull-down node PD<N> under a control of the output signal transmitted by the output signal terminal Oput<N>.

For example, in a case where the output circuit 313 is turned on, and a level of the output signal transmitted by the output signal terminal Oput<N> is a high level (i.e., a level of the second clock signal is a high level), the second reset circuit 315 may be turned on due to an action of the output signal. The second reset circuit 315 may receive the first voltage signal transmitted by the first voltage signal terminal VGL1, and transmit the first voltage signal to the pull-down node PD<N>, so as to pull down and reset the pull-down node PD<N>.

As shown in FIGS. 3 and 4, the second reset circuit 315 includes a sixth transistor T6.

For example, as shown in FIGS. 3 and 4, a control electrode of the sixth transistor T6 is electrically connected to the output signal terminal Oput<N>, a first electrode of the sixth transistor T6 is electrically connected to the pull-down node PD<N>, and a second electrode of the sixth transistor T6 is electrically connected to the first voltage signal terminal VGL1.

Here, in the case where the output circuit 313 is turned on, and the level of the output signal transmitted by the output signal terminal Oput<N> is a high level, the sixth transistor T6 may be turned on due to the action of the output signal. The sixth transistor T6 may transmit the first voltage signal transmitted by the first voltage signal terminal VGL1 to the pull-down node PD<N> to pull down the voltage of the pull-down node PD<N>, so as to reset the pull-down node PD<N>.

For example, as shown in FIGS. 3 and 4, the third reset circuit 316 is electrically connected to the pull-down node, the output signal terminal Oput<N> and the first voltage signal terminal VGL1. The third reset circuit 316 is configured to reset the output signal terminal Oput<N> under the control of the voltage of the pull-down node PD<N>.

For example, in the case where the voltage of the pull-down node PD<N> is at a high level, the third reset circuit 316 may be turned on under the control of the voltage of the pull-down node PD<N>. The third reset circuit 316 may receive the first voltage signal transmitted by the first voltage signal terminal VGL1, and transmit the first voltage signal to the output signal terminal Oput<N>, so as to pull down and reset the output signal terminal Oput<N>.

As shown in FIGS. 3 and 4, the third reset circuit 316 includes a seventh transistor T7 and a second capacitor C2.

For example, as shown in FIGS. 3 and 4, a control electrode of the seventh transistor T7 is electrically connected to the pull-down node PD<N>, a first electrode of the seventh transistor T7 is electrically connected to the output signal terminal Oput<N>, and a second electrode of the seventh transistor T7 is electrically connected to the first voltage signal terminal VGL1. A first electrode of the second capacitor C2 is electrically connected to the pull-down node PD<N>, and a second electrode of the second capacitor C2 is electrically connected to the first voltage signal terminal VGL1.

Here, in the case where the voltage of the pull-down node PD<N> is at a high level, the seventh transistor T7 may be turned on under the control of the voltage of the pull-down node PD<N>. The seventh transistor T7 may transmit the first voltage signal transmitted by the first voltage signal terminal VGL1 to the output signal terminal Oput<N> to pull down a voltage of the output signal terminal Oput<N>, so as to reset the output signal terminal Oput<N>.

In addition, in the case where the voltage of the pull-down node PD<N> is at a high level, the second capacitor C2 is also charged. In a subsequent operating process, the second capacitor C2 may also be discharged, so that the pull-down node PD<N> is maintained at a high level, and thus the seventh transistor T7 may be maintained in an on state. The seventh transistor T7 may continuously receive the first voltage signal and continuously pull down the voltage of the output signal terminal Oput<N>.

It will be noted that the process of resetting the output signal terminal Oput<N> by using the third reset circuit 316 may also be referred to as a process of reducing noise of the output signal terminal Oput<N>, and the third reset circuit 316 may also be referred to as a noise reduction circuit. The noise of the output signal terminal Oput<N> is reduced, so that an output signal of a previous frame at the output signal terminal Oput<N> may be prevented from remaining, so as to ensure an accuracy of the output signal output from the shift register 31 or the scan driving circuit 3, thereby ensuring the display effect of the display panel 100.

For example, as shown in FIGS. 3 and 4, the fourth reset circuit 317 is electrically connected to a display reset signal terminal STD, the pull-up node PU<N> and the third voltage signal terminal VGL2. The fourth reset circuit 317 is configured to reset the pull-up node PU<N> under a control of a display reset signal transmitted by the display reset signal terminal STD.

For example, in a case where a level of the display reset signal is a high level, the fourth reset circuit 317 may be turned on due to an action of the display reset signal. The fourth reset circuit 317 may receive the third voltage signal transmitted by the third voltage signal terminal VGL2, and transmit the third voltage signal to the pull-up node PU<N>, so as to pull down and reset the pull-up node PU<N>.

As shown in FIGS. 3 and 4, the fourth reset circuit 317 includes an eighth transistor T8.

For example, as shown in FIGS. 3 and 4, a control electrode of the eighth transistor T8 is electrically connected to the display reset signal terminal STD, a first electrode of the eighth transistor T8 is electrically connected to the pull-up node PU<N>, and a second electrode of the eighth transistor T8 is electrically connected to the third voltage signal terminal VGL2.

Here, in the case where the level of the display reset signal is a high level, the eighth transistor T8 may be turned on due to the action of the display reset signal. The eighth transistor T8 may transmit the third voltage signal transmitted by the third voltage signal terminal VGL2 to the pull-up node PU<N> to pull down the voltage of the pull-up node PU<N>, so as to reset the pull-up node PU<N>.

It will be noted that after the plurality of stages of shift registers 31 are cascaded to form the scan driving circuit 3, an output signal terminal Oput<N> in a certain stage of shift register 31 may be, for example, electrically connected to a display reset signal terminal STD in a previous stage of shift register 31. In this way, an output signal output from the output signal terminal Oput<N> in this stage of shift register 31 may be used as a display reset signal of the previous stage of shift register 31. Of course, the cascade relationship of the plurality of stages of shift registers 31 is not limited thereto.

Display reset signal terminal(s) STD in part of the shift registers 31 may be electrically connected to a display reset signal line 36, so as to receive a signal transmitted by the display reset signal line 36 as the display reset signal. A description of the display reset signal line 36 may refer to the following description, and will not be repeated here.

The number of shift registers 31 electrically connected to the display reset signal line 36 is not limited, and may be set according to actual needs.

For example, the part of the shift registers 31 electrically connected to the display reset signal line 36 may be, for example, a last stage shift register 31 in the scan driving circuit 3, or the last stage shift register 31 and a penultimate stage shift register 31.

For example, as shown in FIGS. 3 and 4, the fifth reset circuit 318 is electrically connected to a global reset signal terminal TRST, the pull-up node PU<N> and the first voltage signal terminal VGL1. The fifth reset circuit 318 is configured to reset the pull-up node PU<N> under a control of a global reset signal transmitted by the global reset signal terminal TRST.

For example, in a case where a level of the global reset signal is a high level, the fifth reset circuit 318 may be turned on due to an action of the global reset signal. The fifth reset circuit 318 may receive the first voltage signal transmitted by the first voltage signal terminal VGL1, and transmit the first voltage signal to the pull-up node PU<N>, so as to pull down and reset the pull-up node PU<N>.

As shown in FIGS. 3 and 4, the fifth reset circuit 318 includes a ninth transistor T9.

For example, as shown in FIGS. 3 and 4, a control electrode of the ninth transistor T9 is electrically connected to the global reset signal terminal TRST, a first electrode of the ninth transistor T9 is electrically connected to the pull-up node PU<N>, and a second electrode of the ninth transistor T9 is electrically connected to the first voltage signal terminal VGL1.

Here, in the case where the level of the global reset signal is a high level, the ninth transistor T9 may be turned on due to the action of the global reset signal. The ninth transistor T9 may transmit the first voltage signal transmitted by the first voltage signal terminal VGL1 to the pull-up node PU<N> to pull down the voltage of the pull-up node PU<N>, so as to reset the pull-up node PU<N>.

In some examples, as shown in FIG. 4, the shift register 31 may further include an abnormal power-down circuit 319.

For example, as shown in FIG. 4, the abnormal power-down circuit 319 is electrically connected to the output signal terminal Oput<N>, the pull-down node PD<N>, the first voltage signal terminal VGL1 and an abnormal power-down signal terminal EN. The abnormal power-down circuit 319 is configured to, in a case where an abnormal power-down of the display panel 100 occurs, turn on pixel driving circuits 21 in sub-pixels 2 to discharge remaining electric charges.

For example, in the case where the abnormal power-down of the display panel 100 occurs, a level of an abnormal power-down signal transmitted by the abnormal power-down signal terminal EN is a high level. The abnormal power-down circuit 319 may be turned on under a control of the abnormal power-down signal, so as to transmit the first voltage signal to the pull-down node PD<N> and transmit the abnormal power-down signal to the output signal terminal Oput<N>.

As shown in FIG. 4, the abnormal power-down circuit 319 includes a tenth transistor T10 and an eleventh transistor T11.

For example, as shown in FIG. 4, a control electrode of the tenth transistor T10 is electrically connected to the abnormal power-down signal terminal EN, a first electrode of the tenth transistor T10 is electrically connected to the output signal terminal Oput<N>, and a second electrode of the tenth transistor T10 is electrically connected to the abnormal power-down signal terminal EN. A control electrode of the eleventh transistor T11 is electrically connected to the abnormal power-down signal terminal EN, a first electrode of the eleventh transistor T11 is electrically connected to the pull-down node PD<N>, and a second electrode of the eleventh transistor T11 is electrically connected to the first voltage signal terminal VGL1.

Here, in the case where the abnormal power-down of the display panel 100 occurs, the level of the abnormal power-down signal transmitted by the abnormal power-down signal terminal EN is a high level. The tenth transistor T10 and the eleventh transistor T11 may be turned on due to an action of the abnormal power-down signal. The eleventh transistor T11 may transmit the first voltage signal transmitted by the first voltage signal terminal VGL1 to the pull-down node PD<N>. The tenth transistor T10 may transmit the abnormal power-down signal to the output signal terminal Oput<N>, so that the output signal terminal Oput<N> outputs the abnormal power-down signal, so as to control pixel driving circuits 21 in sub-pixels 2 in corresponding row(s) in the display panel 100 to be turned on to discharge the remaining electric charges.

In some examples, as shown in FIGS. 5 to 8, the plurality of stages of shift registers 31 included in the scan driving circuit 3 are located in the display area A. In this way, the shift registers 31 may be prevented from being disposed in the bezel area B, so that an occupied area of the scan driving circuit 3 in the bezel area B is reduced, and thus a size of the bezel area B may be reduced, thereby realizing a narrow bezel, ultra-narrow bezel or even no bezel of the display panel 100.

In some examples, as shown in FIGS. 5 to 8, the scan driving circuit 3 further includes a plurality of clock signal lines 32. After the plurality of stages of shift registers 31 are cascaded, the plurality of stages of shift registers 31 may be electrically connected to the plurality of clock signal lines 32, and the plurality of clock signal lines 32 may transmit clock signals to corresponding shift registers 31.

For example, as shown in FIGS. 5 to 8, the plurality of clock signal lines 32 are located in the display area A. In this way, the number of clock signal lines 32 in the bezel area B may be reduced, and even the clock signal lines 32 may be prevented from being disposed in the bezel area B, so that the occupied area of the scan driving circuit 3 in the bezel area B may be further reduced, and the size of the bezel area B may be further reduced, thereby realizing the narrow bezel, ultra-narrow bezel or even no bezel of the display panel 100.

Furthermore, as shown in FIGS. 5 to 8, the display area A includes a first gap region A1 located between two adjacent columns of sub-pixels. The plurality of clock signal lines 32 may extend in the second direction Y. In a case where a certain clock signal line 32 is disposed in the display area A, this clock signal line 32 may be disposed in the first gap region A1.

Figure 12:
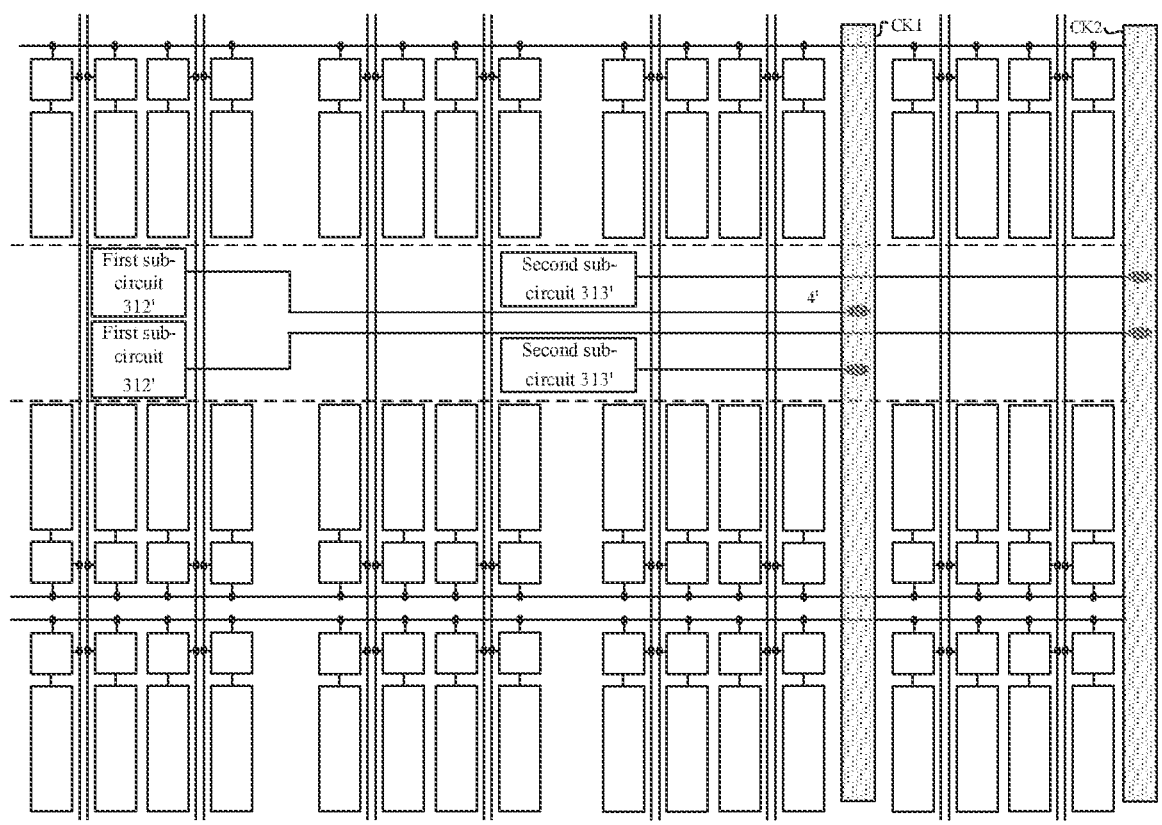
FIG. 12 is a partial structural diagram of a display panel, in accordance with an implementation.

In an implementation, as shown in FIG. 12, in a display panel, a scan driving circuit includes a plurality of stages of shift registers, a first clock signal line CK1 and a second clock signal line CK2. A stage of shift register corresponds to sub-pixels in a row. The first clock signal line CK1 is electrically connected to first sub-circuits 312' in odd-numbered stages of shift registers and second sub-circuits 313' in even-numbered stages of shift registers, and the second clock signal line CK2 is electrically connected to second sub-circuits 313' in the odd-numbered stages of shift registers and first sub-circuits 312' in the even-numbered stages of shift registers. That is, the first clock signal line CK1 is electrically connected to all of the shift registers in the scan driving circuit, and the second clock signal line CK2 is electrically connected to all of the shift registers in the scan driving circuit. In a case where a size or a PPI of the display panel is increased, the number of shift registers in the scan driving circuit is increased, so that the first clock signal line CK1 and the second clock signal line CK2 are each required to be electrically connected to more shift registers. In this way, the number of connection lines 4' connecting the first clock signal line CK1 to the stages of shift registers is increased, and the number of connection lines 4' connecting the second clock signal line CK2 to the stages of shift registers is increased, so that a parasitic capacitance and a resistance of the first clock signal line CK1 are increased, and a parasitic capacitance and a resistance of the second clock signal line CK2 are increased. As a result, a clock signal received by the shift register is seriously attenuated, which affects the display quality of the display panel.

Based on this, as shown in FIGS. 5 to 8, and FIGS. 11*a* and 11*b*, in the display panel 100 in some embodiments of the present disclosure, the plurality of stages of shift registers 31 included in the scan driving circuit 3 may include first shift register(s) 31*a* and second shift register(s) 31*b*. The plurality of clock signal lines 32 included in the scan driving circuit 3 may include first sub-clock signal line(s) 321 and second sub-clock signal line(s) 322.

The number of first shift register(s) 31*a* may be at least one, and the number of second shift register(s) 31*b* may be at least one. The number of first shift register(s) 31*a* and the number of second shift register(s) 31*b* may be set according to the structure of the display panel 100. The number of first sub-clock signal line(s) 321 may be at least one, and the number of second sub-clock signal line(s) 322 may be at least one. The number of first sub-clock signal line(s) 321 and the number of second sub-clock signal line(s) 322 may be set according to the structure of the shift register 31.

For example, a structure of a first shift register 31*a* is the same as a structure of a second shift register 31*b*. At least one row of sub-pixels 2 connected to the first shift register 31*a* are different from at least one row of sub-pixels 2 connected to the second shift register 31*b*. That is, an output signal terminal Oput<N> in the first shift register 31*a* and an output signal terminal Oput<N> in the second shift register 31*b* are electrically connected to different rows of sub-pixels 2, respectively. The first shift register 31*a* and the second shift register 31*b* are different in stage number.

It will be noted that the plurality of stages of shift registers 31 included in the scan driving circuit 3 may further include third shift register(s) 31 or fourth shift register(s) 31. Accordingly, the plurality of clock signal lines 32 included in the scan driving circuit 3 may further include sub-clock signal line(s) electrically connected to the third shift register(s) 31 or the fourth shift register(s) 31. For schematic description, as an example, the scan driving circuit 3 includes the first shift register(s) 31*a* and the second shift register(s) 31*b* in the embodiments of the present disclosure.

Here, an arrangement of the first shift register(s) 31*a* and an arrangement of the second shift register(s) 31*b* vary, and may be set according to actual needs.

For example, a stage of shift register 31 is electrically connected to sub-pixels 2 in rows.

For example, in a case where there are a single first shift register 31*a* and a single second shift register 31*b*, of the first shift register 31*a* and the second shift register 31*b*, one may be any stage of shift register 31, and another one is a different stage of shift register 31.

For another example, in a case where there are a plurality of first shift registers 31*a* and a plurality of second shift registers 31*b*, at least some of the plurality of first shift registers 31*a* may be odd-numbered stages of shift registers, and at least some of the plurality of second shift registers 31*b* may be even-numbered stages of shift registers.

For example, as shown in FIGS. 5 to 8, and FIGS. 11*a* and 11*b*, a stage of shift register 31 is electrically connected to sub-pixels 2 in a row.

For example, in the case where there are a single first shift register 31*a* and a single second shift register 31*b*, of the first shift register 31*a* and the second shift register 31*b*, one may be any stage of shift register 31, and another one is a different stage of shift register 31.

For another example, in the case where there are a plurality of first shift registers 31*a* and a plurality of second shift registers 31*b*, the plurality of first shift registers 31*a* may be odd-numbered stages of shift registers 31, and may be respectively electrically connected to odd-numbered rows of sub-pixels 2. The plurality of second shift registers 31*b* may be even-numbered stages of shift registers 31, and may be respectively electrically connected to even-numbered rows of sub-pixels 2. Alternatively, the plurality of first shift registers 31*a* may be even-numbered stages of shift registers 31, and may be respectively electrically connected to even-numbered rows of sub-pixels 2. The plurality of second shift registers 31*b* may be odd-numbered stages of shift registers 31, and may be respectively electrically connected to odd-numbered rows of sub-pixels 2. Of course, the plurality of first shift registers 31*a* and the plurality of second shift registers 31*b* may be randomly arranged.

In some examples, as shown in FIGS. 5 to 8, the shift register 31 includes the first sub-circuit 312 and the second sub-circuit 313. The first sub-circuit 312 may have the structure as shown in FIG. 2, 3 or 4, and the second sub-circuit 313 may have the structure as shown in FIG. 2, 3 or 4. Of course, the first sub-circuit 312 and the second sub-circuit 313 may each have another structure.

For example, the first sub-circuit 312 needs to receive a clock signal in an operating process. The second sub-circuit 313 needs to receive a clock signal in an operating process. The clock signal received by the first sub-circuit 312 and the clock signal received by the second sub-circuit 313 may be same or different.

For example, a clock signal received by a first sub-circuit 312 in an odd-numbered stage of shift register is the same as a clock signal received by a second sub-circuit 313 in an even-numbered stage of shift register. A clock signal received by a second sub-circuit 313 in the odd-numbered stage of shift register is the same as a clock signal received by a first sub-circuit 312 in the even-numbered stage of shift register.

For example, as shown in FIGS. 5 to 8, a first sub-clock signal line 321 is electrically connected to a first sub-circuit 312 in the first shift register 31*a*, and the first sub-clock signal line 321 is located in a first gap region A1 adjacent to the first sub-circuit 312 in the first shift register 31*a*.

Here, the first sub-clock signal line 321 may be electrically connected to the first sub-circuit 312 in the first shift register 31*a* through a first clock signal terminal CLKA.

In a case where there are a plurality of first shift registers 31*a*, the first sub-clock signal line 321 may be electrically connected to a first sub-circuit 312 in any one of the plurality of first shift registers 31*a*, and the first sub-clock signal line 321 is located in a first gap region A1 adjacent to the first sub-circuits 312 in the plurality of first shift registers 31*a*. That is, the first sub-circuit 312 in any one of the plurality of first shift registers 31a may be electrically connected to the first sub-clock signal line 321 through a corresponding first clock signal terminal CLKA.

As shown in FIGS. 5 to 8, a first connection line 3211 may be provided between the first sub-clock signal line 321 and the first sub-circuit 312 in the first shift register 31a. The first connection line 3211 may be regarded as a branch of the first sub-clock signal line 321, and extend in the first direction X to connect the first sub-circuit 312 in the first shift register 31a.

For example, "the first sub-clock signal line 321 is located in the first gap region A1 adjacent to the first sub-circuit 312 in the first shift register 31a" may mean that in the first direction X, no sub-pixel 2 is disposed between the first gap region A1 where the first sub-clock signal line 321 is located and the first sub-circuit 312 in the first shift register 31a, or one or two columns of sub-pixels 2 are disposed between the first gap region A1 where the first sub-clock signal line 321 is located and the first sub-circuit 312 in the first shift register 31a.

In this way, the first sub-clock signal line 321 and the first sub-circuit 312 in the first shift register 31a may have a small distance therebetween, which effectively reduces a length of the first connection line 3211 between the first sub-clock signal line 321 and the first sub-circuit 312 in the first shift register 31a, and may further reduce a parasitic capacitance and a resistance of the first sub-clock signal line 321. Moreover, the first shift register(s) 31a are part of the plurality of shift registers 31 included in the scan driving circuit 3, which effectively reduces the number of shift registers 31 electrically connected to the first sub-clock signal line 321, and further effectively reduces the number of first connection line(s) 3211 electrically connected to the first sub-clock signal line 321. In this way, the parasitic capacitance and the resistance of the first sub-clock signal line 321 may be further reduced.

For example, as shown in FIGS. 5 to 8, a second sub-clock signal line 322 is electrically connected to one sub-circuit of a first sub-circuit 312 and a second sub-circuit 313 in the second shift register 31b, and the second sub-clock signal line 322 is located in a first gap region A1 adjacent to the one sub-circuit in the second shift register 31b that is electrically connected to the second sub-clock signal line 322.

Figure 5:
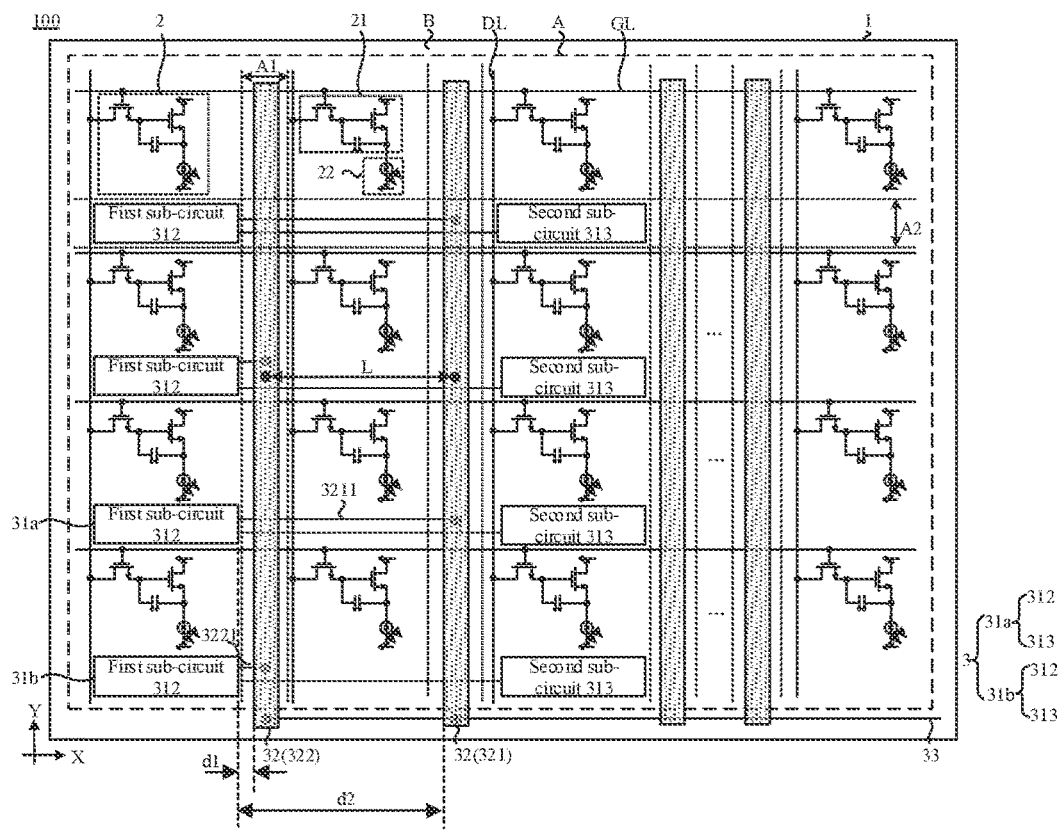
FIG. 5 is a structural diagram of a display panel, in accordance with some embodiments of the present disclosure.
Figure 6:
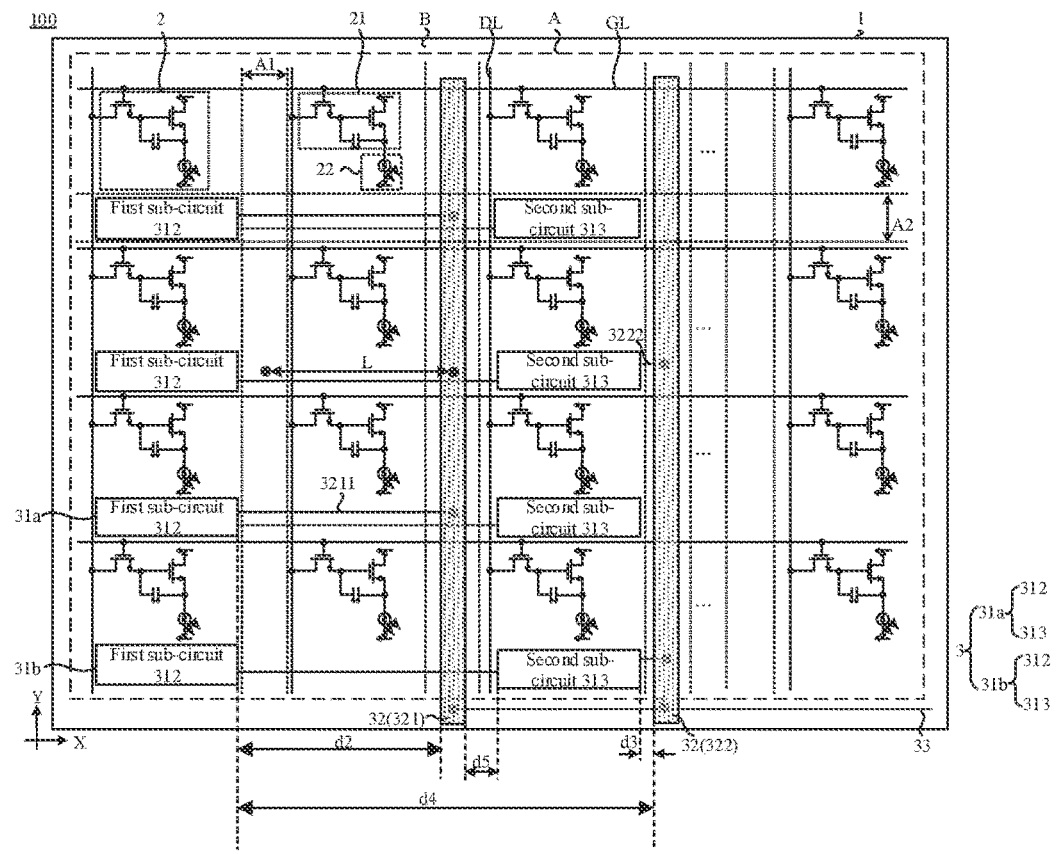
FIG. 6 is a structural diagram of another display panel, in accordance with some embodiments of the present disclosure.
Figure 8:
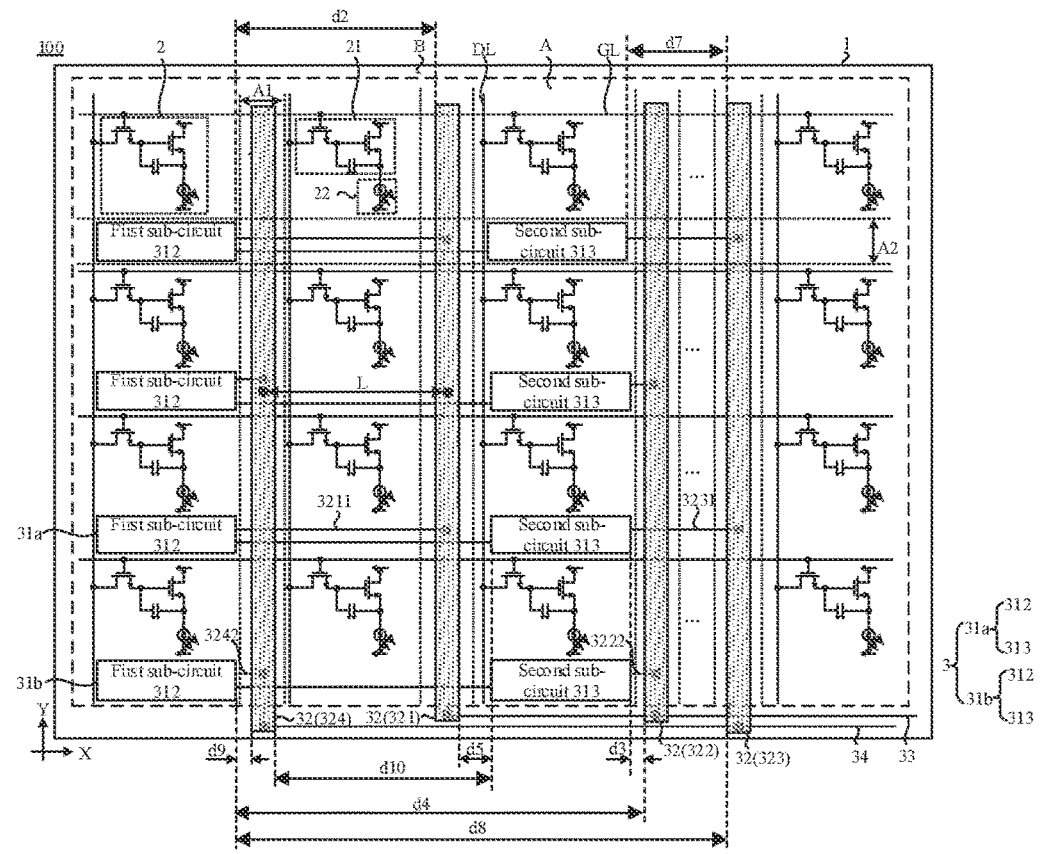
FIG. 8 is a structural diagram of yet another display panel, in accordance with some embodiments of the present disclosure.

That is, as shown in FIGS. 5 and 7, the second sub-clock signal line 322 may be electrically connected to the first sub-circuit 312 in the second shift register 31b, and the second sub-clock signal line 322 is located in a first gap region A1 adjacent to the first sub-circuit 312 in the second shift register 31b. Alternatively, as shown in FIGS. 6 and 8, the second sub-clock signal line 322 may be electrically connected to the second sub-circuit 313 in the second shift register 31b, and the second sub-clock signal line 322 is located in a first gap region A1 adjacent to the second sub-circuit 313 in the second shift register 31b.

In a case where there are a plurality of second shift registers 31b, the second sub-clock signal line 322 may be electrically connected to a first sub-circuit 312 in any one of the plurality of second shift registers 31b, and the second sub-clock signal line 322 is located in a first gap region A1 adjacent to the first sub-circuits 312 in the plurality of second shift registers 31b. Alternatively, the second sub-clock signal line 322 may be electrically connected to a second sub-circuit 313 in any one of the plurality of second shift registers 31b, and the second sub-clock signal line 322 is located in a first gap region A1 adjacent to the second sub-circuits 313 in the plurality of second shift registers 31b.

Here, in a case where the second sub-clock signal line 322 is electrically connected to the first sub-circuit 312 in the second shift register 31b, the second sub-clock signal line 322 may be electrically connected to the first sub-circuit 312 in the second shift register 31b through a first clock signal terminal CLKA. The first sub-circuit 312 in any one of the plurality of second shift registers 31b may be electrically connected to the second sub-clock signal line 322 through a corresponding first clock signal terminal CLKA.

As shown in FIGS. 5 and 7, a second connection line 3221 may be provided between the second sub-clock signal line 322 and the first sub-circuit 312 in the second shift register 31b. The second connection line 3221 may be regarded as a branch of the second sub-clock signal line 322, and extend in the first direction X to connect the first sub-circuit 312 in the second shift register 31b.

For example, "the second sub-clock signal line 322 is located in the first gap region A1 adjacent to the first sub-circuit 312 in the second shift register 31b" may mean that in the first direction X, no sub-pixel 2 is disposed between the first gap region A1 where the second sub-clock signal line 322 is located and the first sub-circuit 312 in the second shift register 31b, or one or two columns of sub-pixels 2 are disposed between the first gap region A1 where the second sub-clock signal line 322 is located and the first sub-circuit 312 in the second shift register 31b.

In this way, the second sub-clock signal line 322 and the first sub-circuit 312 in the second shift register 31b may have a small distance therebetween, which effectively reduces a length of the second connection line 3221 between the second sub-clock signal line 322 and the first sub-circuit 312 in the second shift register 31b, and may further reduce a parasitic capacitance and a resistance of the second sub-clock signal line 322. Moreover, the second shift register(s) 31b are part of the plurality of shift registers 31 included in the scan driving circuit 3, which effectively reduces the number of shift registers 31 electrically connected to the second sub-clock signal line 322, and further effectively reduces the number of second connection line(s) 3221 electrically connected to the second sub-clock signal line 322. In this way, the parasitic capacitance and the resistance of the second sub-clock signal line 322 may be further reduced.

Here, in a case where the second sub-clock signal line 322 is electrically connected to the second sub-circuit 313 in the second shift register 31b, the second sub-clock signal line 322 may be electrically connected to the second sub-circuit 313 in the second shift register 31b through a second clock signal terminal CLKB. The second sub-circuit 313 in any one of the plurality of second shift registers 31b may be electrically connected to the second sub-clock signal line 322 through a corresponding second clock signal terminal CLKB.

As shown in FIGS. 6 and 8, a third connection line 3222 may be provided between the second sub-clock signal line 322 and the second sub-circuit 313 in the second shift register 31b. The third connection line 3222 may be regarded as a branch of the second sub-clock signal line 322, and extend in the first direction X to connect the second sub-circuit 313 in the second shift register 31b.

For example, "the second sub-clock signal line 322 is located in the first gap region A1 adjacent to the second sub-circuit 313 in the second shift register 31b" may mean that in the first direction X, no sub-pixel 2 is disposed between the first gap region A1 where the second sub-clock signal line 322 is located and the second sub-circuit 313 in the second shift register 31b, or one or two columns of sub-pixels 2 are disposed between the first gap region A1 where the second sub-clock signal line 322 is located and the second sub-circuit 313 in the second shift register 31*b*.

In this way, the second sub-clock signal line 322 and the second sub-circuit 313 in the second shift register 31*b* may have a small distance therebetween, which effectively reduces a length of the third connection line 3222 between the second sub-clock signal line 322 and the second sub-circuit 313 in the second shift register 31*b*, and may further reduce the parasitic capacitance and the resistance of the second sub-clock signal line 322. Moreover, the second shift register(s) 31*b* are part of the plurality of shift registers 31 included in the scan driving circuit 3, which effectively reduces the number of shift registers 31 electrically connected to the second sub-clock signal line 322, and further effectively reduces the number of third connection line(s) 3222 electrically connected to the second sub-clock signal line 322. In this way, the parasitic capacitance and the resistance of the second sub-clock signal line 322 may be further reduced.

In some examples, a clock signal transmitted by the first sub-clock signal line 321 is the same as a clock signal transmitted by the second sub-clock signal line 322.

For example, in the case where the second sub-clock signal line 322 is electrically connected to the first sub-circuit 312 in the second shift register 31*b*, a first clock signal received by the first sub-circuit 312 in the first shift register 31*a* is the same as a first clock signal received by the first sub-circuit 312 in the second shift register 31*b*. On this basis, for example, the first sub-clock signal line 321 and the second sub-clock signal line 322 may be respectively regarded as two branches of a signal line electrically connected to corresponding clock signal terminals (the clock signal terminals receive a same clock signal) in different shift registers. This is beneficial to reducing the number of shift registers 31 electrically connected to the first sub-clock signal line 321 and reducing a distance between the first sub-clock signal line 321 and a first sub-circuit 312 in a corresponding shift register 31, and is beneficial to reducing the number of shift registers 31 electrically connected to the second sub-clock signal line 322 and reducing a distance between the second sub-clock signal line 322 and a first sub-circuit 312 in a corresponding shift register 31.

For example, in the case where the second sub-clock signal line 322 is electrically connected to the second sub-circuit 313 in the second shift register 31*b*, the first clock signal received by the first sub-circuit 312 in the first shift register 31*a* is the same as a second clock signal received by the second sub-circuit 313 in the second shift register 31*b*. In the display process of the display panel 100, a same clock signal may be synchronously transmitted to the first sub-clock signal line 321 and the second sub-clock signal line 322. On this basis, for example, the first sub-clock signal line 321 and the second sub-clock signal line 322 may be respectively regarded as two branches of the first clock signal line CK1 or the second clock signal line CK2 in the above implementation. This is beneficial to reducing the number of shift registers 31 electrically connected to the first sub-clock signal line 321 and reducing a distance between the first sub-clock signal line 321 and a first sub-circuit 312 in a corresponding shift register 31, and is beneficial to reducing the number of shift registers 31 electrically connected to the second sub-clock signal line 322 and reducing a distance between the second sub-clock signal line 322 and a second sub-circuit 313 in a corresponding shift register 31.

In some examples, as shown in FIGS. 5 to 8, the first gap region A1 where the first sub-clock signal line 321 is located is different from the first gap region A1 where the second sub-clock signal line 322 is located.

That is, in a case where a first gap region A1 is provided with clock signal line(s) 32 therein, there is one type of clock signal line 32 (e.g., the first sub-clock signal line 321 or the second sub-clock signal line 322). In this way, signal cross-talk may be avoided.

Thus, in the display panel 100 provided in some embodiments of the present disclosure, the plurality of shift registers 31 in the scan driving circuit 3 and the plurality of clock signal lines 32 are disposed in the display area A, so that the occupied area of the scan driving circuit 3 in the bezel area B may be reduced, which is beneficial to reducing the size of the bezel area B, thereby realizing the narrow bezel, ultra-narrow bezel or even no bezel of the display panel 100.

Moreover, in the embodiments of the present disclosure, the first sub-circuit 312 in the first shift register 31*a* is electrically connected to the first sub-clock signal line 321, and the first sub-clock signal line 321 is disposed in the first gap region A1 adjacent to the first sub-circuit 312 in the first shift register 31*a*. The first sub-circuit 312 or the second sub-circuit 313 in the second shift register 31*b* is electrically connected to the second sub-clock signal line 322, and the second sub-clock signal line 322 is disposed in the first gap region A1 adjacent to the first sub-circuit 312 or the second sub-circuit 313 in the second shift register 31*b*, and the first sub-clock signal line 321 and the second sub-clock signal line 322 transmit the same clock signal. Therefore, the number of shift registers 31 electrically connected to the first sub-clock signal line 321 may be effectively reduced, and a distance between the first sub-clock signal line 321 and a corresponding first sub-circuit 312 is reduced (that is, the length of the first connection line 3211 between the first sub-clock signal line 321 and the corresponding first sub-circuit 312 is reduced), which is beneficial to reducing the parasitic capacitance and the resistance of the first sub-clock signal line 321, so as to improve the signal attenuation of the clock signal transmitted by the first sub-clock signal line 321. The number of shift registers 31 electrically connected to the second sub-clock signal line 322 may be effectively reduced, and a distance between the second sub-clock signal line 322 and a corresponding first sub-circuit 312 (i.e., the length of the second connection line 3221 between the second sub-clock signal line 322 and the corresponding first sub-circuit 312) or a distance between the second sub-clock signal line 322 and a corresponding second sub-circuit 313 (i.e., the length of the third connection line 3222 between the second sub-clock signal line 322 and the corresponding second sub-circuit 313) is reduced, which is beneficial to reducing the parasitic capacitance and the resistance of the second sub-clock signal line 322, so as to improve the signal attenuation of the clock signal transmitted by the second sub-clock signal line 322. In this way, the display quality of the display panel 100 may be effectively improved.

In some embodiments, as shown in FIGS. 5 and 7, in the case where the second sub-clock signal line 322 is electrically connected to the first sub-circuit 312 in the second shift register 31*b*, the distance d1 between the second sub-clock signal line 322 and the first sub-circuit 312 in the second shift register 31*b* is less than the distance d2 between the first sub-clock signal line 321 and the first sub-circuit 312 in the first shift register 31*a*.

In some examples, as shown in FIGS. 5 and 7, the first sub-circuit(s) 312 in the first shift register(s) 31*a* and the first sub-circuit(s) 312 in the second shift register(s) 31*b* may be arranged in a column in the second direction Y. This is beneficial to simplifying the wiring design of the shift registers 31 and simplifying the manufacturing process of the shift registers 31.

The distance d2 between the first sub-clock signal line 321 and the first sub-circuit 312 in the first shift register 31a is greater than the distance d1 between the second sub-clock signal line 322 and the first sub-circuit 312 in the second shift register 31b, which means that the first sub-clock signal line 321 is farther from the first sub-circuit(s) 312 in the first shift register(s) 31a and the first sub-circuit(s) 312 in the second shift register(s) 31b than the second sub-clock signal line 322.

An arrangement of the first sub-clock signal line 321, the second sub-clock signal line 322 and the first sub-circuit 312 varies, and may be set according to actual needs.

For example, the first sub-clock signal line 321 and the second sub-clock signal line 322 are located on two sides of the first sub-circuit 312, respectively. That is, the first sub-circuit 312 is located between the first sub-clock signal line 321 and the second sub-clock signal line 322, and the distance between the first sub-clock signal line 321 and the first sub-circuit 312 is greater than the distance between the second sub-clock signal line 322 and the first sub-circuit 312.

For example, as shown in FIGS. 5 and 7, the first sub-clock signal line 321 and the second sub-clock signal line 322 are located on the same side of the first sub-circuit 312 (e.g., a left side or a right side of the first sub-circuit 312), and the second sub-clock signal line 322 is located between the first sub-clock signal line 321 and the first sub-circuit 312.

In some embodiments, as shown in FIGS. 6 and 8, in the case where the second sub-clock signal line 322 is electrically connected to the second sub-circuit 313 in the second shift register 31b, the distance d3 between the second sub-clock signal line 322 and the second sub-circuit 313 in the second shift register 31b is less than a distance d4 between the second sub-clock signal line 322 and the first sub-circuit 312 in the first shift register 31a. The distance d2 between the first sub-clock signal line 321 and the first sub-circuit 312 in the first shift register 31a is greater than a distance d5 between the first sub-clock signal line 321 and the second sub-circuit 313 in the second shift register 31b.

Here, an arrangement of the first sub-clock signal line 321, the second sub-clock signal line 322, the first sub-circuit 312 and the second sub-circuit 313 varies, and may be set according to actual needs.

For example, the first sub-clock signal line 321 and the second sub-clock signal line 322 may be located between the first sub-circuit 312 in the first shift register 31a and the second sub-circuit 313 in the second shift register 31b. The first sub-clock signal line 321 is closer to the first sub-circuit 312 in the first shift register 31a than to the second sub-circuit 313 in the second shift register 31b, and the second sub-clock signal line 322 is closer to the second sub-circuit 313 in the second shift register 31b than to the first sub-circuit 312 in the first shift register 31a.

For example, as shown in FIGS. 6 and 8, the first sub-clock signal line 321 may be located between the first sub-circuit 312 in the first shift register 31a and the second sub-circuit 313 in the second shift register 31b, and the second sub-clock signal line 322 is farther from the first sub-clock signal line 321 than the second sub-circuit 313 in the second shift register 31b.

Based on this, for example, the first sub-circuit 312 in the first shift register 31a and the second sub-circuit 313 in the second shift register 31b are sequentially arranged in the first direction X. The first sub-clock signal line 321 may be located at a right side of the first sub-circuit 312 in the first shift register 31a, and the second sub-clock signal line 322 may be located at a right side of the second sub-circuit 313 in the second shift register 31b.

It will be noted that in the implementation, the first clock signal line CK1 is electrically connected to the first sub-circuits 312' in the odd-numbered stages of shift registers and the second sub-circuits 313' in the even-numbered stages of shift registers. A distance between the first clock signal line CK1 and the first sub-circuit 312' in the odd-numbered stage of shift register is large, and is several times or even more than ten times a distance between the first clock signal line CK1 and the second sub-circuit 313' in the even-numbered stage of shift register. The second clock signal line CK2 is similar thereto.

In these examples, for example, the first sub-clock signal line 321 and the second sub-clock signal line 322 may be regarded as two branches of the first clock signal line CK1 or the second clock signal line CK2 in the implementation.

By arranging the first sub-clock signal line 321 and the second sub-clock signal line 322 with the above arrangements, the distance between the first sub-clock signal line 321 and the first sub-circuit 312 in the first shift register 31a may be effectively reduced. For example, compared to the implementation, the distance between the first sub-clock signal line 321 and the first sub-circuit 312 in the first shift register 31a may be less than the distance between the first clock signal line CK1 and the first sub-circuit 312' in the odd-numbered stage of shift register. This is beneficial to reducing the length of the first connection line 3211 disposed between the first sub-clock signal line 321 and the first sub-circuit 312 in the first shift register 31a, so that the parasitic capacitance and the resistance of the first sub-clock signal line 321 is effectively reduced, so as to improve the display quality of the display panel 100.

In some embodiments, as shown in FIGS. 7 and 8, the plurality of clock signal lines 32 included in the scan driving circuit 3 further include third sub-clock signal line(s) 323 and fourth sub-clock signal line(s) 324. The number of third sub-clock signal line(s) 323 may be at least one, and the number of fourth sub-clock signal line(s) 324 may be at least one. The number of third sub-clock signal line(s) 323 and the number of fourth sub-clock signal line(s) 324 may be set according to the structure of the shift register 31.

In some examples, as shown in FIGS. 7 and 8, a third sub-clock signal line 323 is electrically connected to the second sub-circuit 313 in the first shift register 31a, and the third sub-clock signal line 323 is located in a first gap region A1 adjacent to the second sub-circuit 313 in the first shift register 31a.

Here, the third sub-clock signal line 323 may be electrically connected to the second sub-circuit 313 in the first shift register 31a through a second clock signal terminal CLKB.

In the case where there are the plurality of first shift registers 31a, the third sub-clock signal line 323 may be electrically connected to the second sub-circuits 313 in the plurality of first shift registers 31a, and the third sub-clock signal line 323 may be located in a first gap region A1 adjacent to the second sub-circuits 313 in the plurality of first shift registers 31a. That is, the second sub-circuit 313 in any one of the plurality of first shift registers 31a may be electrically connected to the third sub-clock signal line 323 through a corresponding second clock signal terminal CLKB.

As shown in FIGS. 7 and 8, a fourth connection line 3231 may be provided between the third sub-clock signal line 323 and the second sub-circuit 313 in the first shift register 31a. The fourth connection line 3231 may be regarded as a branch of the third sub-clock signal line 323, and extend in the first direction X to connect the second sub-circuit 313 in the first shift register 31a.

For example, "the third sub-clock signal line 323 is located in the first gap region A1 adjacent to the second sub-circuit 313 in the first shift register 31a" may mean that in the first direction X, no sub-pixel 2 is disposed between the first gap region A1 where the third sub-clock signal line 323 is located and the second sub-circuit 313 in the first shift register 31a, or one or two columns of sub-pixels 2 are disposed between the first gap region A1 where the third sub-clock signal line 323 is located and the second sub-circuit 313 in the first shift register 31a.

In this way, the third sub-clock signal line 323 and the second sub-circuit 313 in the first shift register 31a may have a small distance therebetween, which effectively reduces a length of the fourth connection line 3231 between the third sub-clock signal line 323 and the second sub-circuit 313 in the first shift register 31a, and may further reduce a parasitic capacitance and a resistance of the third sub-clock signal line 323. Moreover, the first shift register(s) 31a are part of the plurality of shift registers 31 included in the scan driving circuit 3, which effectively reduces the number of shift registers 31 electrically connected to the third sub-clock signal line 323, and further effectively reduces the number of fourth connection line(s) 3231 electrically connected to the third sub-clock signal line 323. In this way, the parasitic capacitance and the resistance of the third sub-clock signal line 323 may be further reduced.

In some examples, a fourth sub-clock signal line 324 is electrically connected to another sub-circuit of the first sub-circuit 312 and the second sub-circuit 313 in the second shift register 31b, and the fourth sub-clock signal line 324 is located in a first gap region A1 adjacent to the another sub-circuit in the second shift register 31b that is electrically connected to the fourth sub-clock signal line 324.

That is, as shown in FIG. 7, in the case where the second sub-clock signal line 322 is electrically connected to the first sub-circuit 312 in the second shift register 31b, the fourth sub-clock signal line 324 may be electrically connected to the second sub-circuit 313 in the second shift register 31b, and the fourth sub-clock signal line 324 is located in the first gap region A1 adjacent to the second sub-circuit 313 in the second shift register 31b. Alternatively, as shown in FIG. 8, in the case where the second sub-clock signal line 322 is electrically connected to the second sub-circuit 313 in the second shift register 31b, the fourth sub-clock signal line 324 may be electrically connected to the first sub-circuit 312 in the second shift register 31b.

In the case where there are the plurality of second shift registers 31b, the fourth sub-clock signal line 324 may be electrically connected to the second sub-circuits 313 in the plurality of second shift registers 31b, and the fourth sub-clock signal line 324 is located in the first gap region A1 adjacent to the second sub-circuits 313 in the plurality of second shift registers 31b. Alternatively, the fourth sub-clock signal line 324 may be electrically connected to the first sub-circuits 312 in the plurality of second shift registers 31b, and the fourth sub-clock signal line 324 is located in the first gap region A1 adjacent to the first sub-circuits 312 in the plurality of second shift registers 31b.

Here, in a case where the fourth sub-clock signal line 324 is electrically connected to the second sub-circuit 313 in the second shift register 31b, the fourth sub-clock signal line 324 may be electrically connected to the second sub-circuit 313 in the second shift register 31b through a second clock signal terminal CLKB. The second sub-circuit 313 in any one of the plurality of second shift registers 31b may be electrically connected to the fourth sub-clock signal line 324 through a corresponding second clock signal terminal CLKB.

As shown in FIG. 7, a fifth connection line 3241 may be provided between the fourth sub-clock signal line 324 and the second sub-circuit 313 in the second shift register 31b. The fifth connection line 3241 may be regarded as a branch of the fourth sub-clock signal line 324, and extend in the first direction X to connect the second sub-circuit 313 in the second shift register 31b.

For example, "the fourth sub-clock signal line 324 is located in the first gap region A1 adjacent to the second sub-circuit 313 in the second shift register 31b" may mean that in the first direction X, no sub-pixel 2 is disposed between the first gap region A1 where the fourth sub-clock signal line 324 is located and the second sub-circuit 313 in the second shift register 31b, or one or two columns of sub-pixels 2 are disposed between the first gap region A1 where the fourth sub-clock signal line 324 is located and the second sub-circuit 313 in the second shift register 31b.

In this way, the fourth sub-clock signal line 324 and the second sub-circuit 313 in the second shift register 31b may have a small distance therebetween, which effectively reduces a length of the fifth connection line 3241 between the fourth sub-clock signal line 324 and the second sub-circuit 313 in the second shift register 31b, and may further reduce a parasitic capacitance and a resistance of the fourth sub-clock signal line 324. Moreover, the second shift register(s) 31b are part of the plurality of shift registers 31 included in the scan driving circuit 3, which effectively reduces the number of shift registers 31 electrically connected to the fourth sub-clock signal line 324, and further effectively reduces the number of fifth connection line(s) 3241 electrically connected to the fourth sub-clock signal line 324. In this way, the parasitic capacitance and the resistance of the fourth sub-clock signal line 324 may be further reduced.

Here, in a case where the fourth sub-clock signal line 324 is electrically connected to the first sub-circuit 312 in the second shift register 31b, the fourth sub-clock signal line 324 may be electrically connected to the first sub-circuit 312 in the second shift register 31b through a first clock signal terminal CLKA. The first sub-circuit 312 in any one of the plurality of second shift registers 31b may be electrically connected to the fourth sub-clock signal line 324 through a corresponding first clock signal terminal CLKA.

As shown in FIG. 8, a sixth connection line 3242 may be provided between the fourth sub-clock signal line 324 and the first sub-circuit 312 in the second shift register 31b. The sixth connection line 3242 may be regarded as a branch of the fourth sub-clock signal line 324, and extend in the first direction X to connect the first sub-circuit 312 in the second shift register 31b.

For example, "the fourth sub-clock signal line 324 is located in the first gap region A1 adjacent to the first sub-circuit 312 in the second shift register 31b" may mean that in the first direction X, no sub-pixel 2 is disposed between the first gap region A1 where the fourth sub-clock signal line 324 is located and the first sub-circuit 312 in the second shift register 31b, or one or two columns of sub-pixels 2 are disposed between the first gap region A1 where the fourth sub-clock signal line 324 is located and the first sub-circuit 312 in the second shift register 31b.

In this way, the fourth sub-clock signal line 324 and the first sub-circuit 312 in the second shift register 31b may have a small distance therebetween, which effectively reduces a length of the sixth connection line 3242 between the fourth sub-clock signal line 324 and the first sub-circuit 312 in the second shift register 31b, and may further reduces the parasitic capacitance and the resistance of the fourth sub-clock signal line 324. Moreover, the second shift register(s) 31b are part of the plurality of shift registers 31 included in the scan driving circuit 3, which effectively reduces the number of shift registers 31 electrically connected to the fourth sub-clock signal line 324, and further effectively reduces the number of sixth connection line(s) 3242 electrically connected to the fourth sub-clock signal line 324. In this way, the parasitic capacitance and the resistance of the fourth sub-clock signal line 324 may be further reduced.

In some examples, a clock signal transmitted by the third sub-clock signal line 323 is the same as a clock signal transmitted by the fourth sub-clock signal line 324.

For example, in the case where the second sub-clock signal line 322 is electrically connected to the first sub-circuit 312 in the second shift register 31b, the fourth sub-clock signal line 324 is electrically connected to the second sub-circuit 313 in the second shift register 31b. In this case, a second clock signal received by the second sub-circuit 313 in the first shift register 31a is the same as the second clock signal received by the second sub-circuit 313 in the second shift register 31b. On this basis, for example, the third sub-clock signal line 323 and the fourth sub-clock signal line 324 may be respectively regarded as two branches of a signal line electrically connected to corresponding clock signal terminals (the clock signal terminals receive a same clock signal) in different shift registers. This is beneficial to reducing the number of shift registers 31 electrically connected to the third sub-clock signal line 323 and reducing a distance between the third sub-clock signal line 323 and a second sub-circuit 313 in a corresponding shift register 31, and is beneficial to reducing the number of shift registers 31 electrically connected to the fourth sub-clock signal line 324 and reducing a distance between the fourth sub-clock signal line 324 and a second sub-circuit 313 in a corresponding shift register 31.

For example, in the case where the second sub-clock signal line 322 is electrically connected to the second sub-circuit 313 in the second shift register 31b, the fourth sub-clock signal line 324 is electrically connected to the first sub-circuit 312 in the second shift register 31b. In this case, the second clock signal received by the second sub-circuit 313 in the first shift register 31a is the same as the first clock signal received by the first sub-circuit 312 in the second shift register 31b. In the display process of the display panel 100, a same clock signal may be synchronously transmitted to the third sub-clock signal line 323 and the fourth sub-clock signal line 324. On this basis, for example, the third sub-clock signal line 323 and the fourth sub-clock signal line 324 may be regarded as two branches of the first clock signal line CK1 or the second clock signal line CK2 in the implementation. This is beneficial to reducing the number of shift registers 31 electrically connected to the third sub-clock signal line 323 and reducing a distance between the third sub-clock signal line 323 and a second sub-circuit 313 in a corresponding shift register 31, and is beneficial to reducing the number of shift registers 31 electrically connected to the fourth sub-clock signal line 324 and reducing a distance between the fourth sub-clock signal line 324 and a first sub-circuit 312 in a corresponding shift register 31.

In the embodiments of the present disclosure, the third sub-clock signal line 323 is electrically connected to the second sub-circuit 313 in the first shift register 31a, and the third sub-clock signal line 323 is disposed in the first gap region A1 adjacent to the second sub-circuit 313 in the first shift register 31a. The fourth sub-clock signal line 324 is electrically connected to the second sub-circuit 313 or the first sub-circuit 312 in the second shift register 31b, and the fourth sub-clock signal line 324 is disposed in the first gap region A1 adjacent to the second sub-circuit 313 or the first sub-circuit 312 in the second shift register 31b, and the third sub-clock signal line 323 and the fourth sub-clock signal line 324 transmit the same clock signal. Therefore, the number of shift registers 31 electrically connected to the third sub-clock signal line 323 may be effectively reduced, and a distance between the third sub-clock signal line 323 and a corresponding second sub-circuit 313 is reduced (that is, the length of the fourth connection line 3231 between the third sub-clock signal line 323 and the corresponding second sub-circuit 313 is reduced), which is beneficial to reducing the parasitic capacitance and the resistance of the third sub-clock signal line 323, so as to improve the signal attenuation of the clock signal transmitted by the third sub-clock signal line 323. The number of shift registers 31 electrically connected to the fourth sub-clock signal line 324 may be effectively reduced, and a distance between the fourth sub-clock signal line 324 and a corresponding second sub-circuit 313 (i.e., the length of the fifth connection line 3241 between the fourth sub-clock signal line 324 and the corresponding second sub-circuit 313) or a distance between the fourth sub-clock signal line 324 and a corresponding first sub-circuit 312 (i.e., the length of the sixth connection line 3242 between the fourth sub-clock signal line 324 and the corresponding first sub-circuit 312) is reduced, which is beneficial to reducing the parasitic capacitance and the resistance of the fourth sub-clock signal line 324, so as to improve the signal attenuation of the clock signal transmitted by the fourth sub-clock signal line 324. In this way, the display quality of the display panel 100 may be effectively improved.

In some examples, as shown in FIGS. 7 and 8, the first gap region A1 where the third sub-clock signal line 323 is located is different from the first gap region A1 where the fourth sub-clock signal line 324 is located.

That is, in a case where a clock signal line 32 is disposed in the first gap region A1, there is one type of clock signal line 32 (e.g., the third sub-clock signal line 323 or the fourth sub-clock signal line 324). In this way, signal crosstalk may be avoided.

In some embodiments, as shown in FIG. 7, in the case where the second sub-clock signal line 322 is electrically connected to the first sub-circuit 312 in the second shift register 31b, the fourth sub-clock signal line 324 is electrically connected to the second sub-circuit 313 in the second shift register 31b. The distance d6 between the fourth sub-clock signal line 324 and the second sub-circuit 313 in the second shift register 31b is less than the distance d7 between the third sub-clock signal line 323 and the second sub-circuit 313 in the first shift register 31a.

In some examples, as shown in FIG. 7, the second sub-circuit(s) 313 in the first shift register(s) 31a and the second sub-circuit(s) 313 in the second shift register(s) 31b may be arranged in a column in the second direction Y. This is beneficial to simplifying the wiring design of the shift registers 31 and simplifying the manufacturing process of the shift registers 31.

The distance d7 between the third sub-clock signal line 323 and the second sub-circuit 313 in the first shift register 31a is greater than the distance d6 between the fourth sub-clock signal line 324 and the second sub-circuit 313 in the second shift register 31b, which means that the third sub-clock signal line 323 is farther from the second sub-circuit(s) 313 in the first shift register(s) 31a and the second sub-circuit(s) 313 in the second shift register(s) 31b than the fourth sub-clock signal line 324.

An arrangement of the third sub-clock signal line 323, the fourth sub-clock signal line 324 and the second sub-circuit 313 varies, and may be set according to actual needs.

For example, the third sub-clock signal line 323 and the fourth sub-clock signal line 324 are located on two sides of the second sub-circuit 313, respectively. That is, the second sub-circuit 313 is located between the third sub-clock signal line 323 and the fourth sub-clock signal line 324, and the distance between the third sub-clock signal line 323 and the second sub-circuit 313 is greater than the distance between the fourth sub-clock signal line 324 and the second sub-circuit 313.

For example, as shown in FIG. 7, the third sub-clock signal line 323 and the fourth sub-clock signal line 324 are located on the same side of the second sub-circuit 313 (e.g., a left side or a right side of the second sub-circuit 313), and the fourth sub-clock signal line 324 is located between the third sub-clock signal line 323 and the second sub-circuit 313.

In some embodiments, as shown in FIG. 8, in the case where the second sub-clock signal line 322 is electrically connected to the second sub-circuit 313 in the second shift register 31b, the fourth sub-clock signal line 324 is electrically connected to the first sub-circuit 312 in the second shift register 31b. The distance d7 between the third sub-clock signal line 323 and the second sub-circuit 313 in the first shift register 31a is less than a distance d8 between the third sub-clock signal line 323 and the first sub-circuit 312 in the second shift register 31b. The distance d9 between the fourth sub-clock signal line 324 and the first sub-circuit 312 in the second shift register 31b is less than a distance d10 between the fourth sub-clock signal line 324 and the second sub-circuit 313 in the first shift register 31a.

Here, an arrangement of the third sub-clock signal line 323, the fourth sub-clock signal line 324, the first sub-circuit 312 and the second sub-circuit 313 varies, and may be set according to actual needs.

For example, the third sub-clock signal line 323 and the fourth sub-clock signal line 324 may be located between the second sub-circuit 313 in the first shift register 31a and the first sub-circuit 312 in the second shift register 31b. The fourth sub-clock signal line 324 is closer to the first sub-circuit 312 in the second shift register 31b than to the second sub-circuit 313 in the first shift register 31a, and the third sub-clock signal line 323 is closer to the second sub-circuit 313 in the first shift register 31a than to the first sub-circuit 312 in the second shift register 31b.

For example, as shown in FIG. 8, the fourth sub-clock signal line 324 may be located between the second sub-circuit 313 in the first shift register 31a and the first sub-circuit 312 in the second shift register 31b, and the third sub-clock signal line 323 is farther from the fourth sub-clock signal line 324 than the second sub-circuit 313 in the first shift register 31a.

Based on this, for example, the first sub-circuit 312 in the second shift register 31b and the second sub-circuit 313 in the first shift register 31a are sequentially arranged in the first direction X. The fourth sub-clock signal line 324 may be located at a right side of the first sub-circuit 312 in the second shift register 31b, and the third sub-clock signal line 323 may be located at a right side of the second sub-circuit 313 in the first shift register 31a.

It will be noted that in the implementation, the first clock signal line CK1 is electrically connected to the first sub-circuits 312' in the odd-numbered stages of shift registers and the second sub-circuits 313' in the even-numbered stages of shift registers. The distance between the first clock signal line CK1 and the first sub-circuit 312' in the odd-numbered stage of shift register is large, and is several times or even more than ten times the distance between the first clock signal line CK1 and the second sub-circuit 313' in the even-numbered stage of shift register. The second clock signal line CK2 is similar thereto.

In these examples, for example, the third sub-clock signal line 323 and the fourth sub-clock signal line 324 may be regarded as two branches of the first clock signal line CK1 or the second clock signal line CK2 in the implementation.

By arranging the third sub-clock signal line 323 and the fourth sub-clock signal line 324 with the above arrangements, the distance between the third sub-clock signal line 323 and the second sub-circuit 313 in the first shift register 31a may be effectively reduced. For example, compared to the implementation, the distance between the fourth sub-clock signal line 324 and the first sub-circuit 312 in the second shift register 31b may be less than the distance between the second clock signal line CK2 and the first sub-circuit 312' in the even-numbered stage of shift register. This is beneficial to effectively reducing the length of the sixth connection line 3242 disposed between the fourth sub-clock signal line 324 and the first sub-circuit 312 in the second shift register 31b, so that the parasitic capacitance and the resistance of the fourth sub-clock signal line 324 is effectively reduced, so as to improve the display quality of the display panel 100.

In some embodiments, a sub-pixel 2 has a first dimension value in the first direction X. The first dimension value L of the sub-pixel 2 in the first direction X may refer to a distance between centers of two adjacent sub-pixels 2 in the first direction X, or a distance between centers of first gap regions A1 respectively located at two sides of the sub-pixel 2 in the first direction X.

In some examples, the distance d2 between the first sub-circuit 312 in the first shift register 31a and the first sub-clock signal line 321 is less than or equal to four times the first dimension value L. That is, in the first direction X, no sub-pixel 2 may be disposed between the first sub-clock signal line 321 and a corresponding first sub-circuit 312, or one to four columns of sub-pixels 2 may be disposed between the first sub-clock signal line 321 and the corresponding first sub-circuit 312.

In this way, the distance between the first sub-clock signal line 321 and the corresponding first sub-circuit 312 may be effectively reduced, and the parasitic capacitance and the resistance of the first sub-clock signal line 321 may be reduced, so that a severe attenuation of the clock signal in a process of transmitting in the first sub-clock signal line 321 is improved, and thus the display quality of the display panel 100 is improved.

In some examples, the distance d7 between the second sub-circuit 313 in the first shift register 31a and the third sub-clock signal line 323 is less than or equal to four times the first dimension value L. That is, in the first direction X, no sub-pixel 2 may be disposed between the third sub-clock signal line 323 and a corresponding second sub-circuit 313, or one to four columns of sub-pixels 2 may be disposed between the third sub-clock signal line 323 and the corresponding second sub-circuit 313.

In this way, the distance between the third sub-clock signal line 323 and the corresponding second sub-circuit 313 may be effectively reduced, and the parasitic capacitance and the resistance of the third sub-clock signal line 323 may be reduced, so that a severe attenuation of the clock signal in a process of transmitting in the third sub-clock signal line 323 is improved, and thus the display quality of the display panel 100 is improved.

In some examples, in the case where the second sub-clock signal line 322 is electrically connected to the first sub-circuit 312 in the second shift register 31b, the fourth sub-clock signal line 324 is electrically connected to the second sub-circuit 313 in the second shift register 31b. The distance d1 between the first sub-circuit 312 in the second shift register 31b and the second sub-clock signal line 322 is less than or equal to four times the first dimension value L. That is, in the first direction X, no sub-pixel 2 may be disposed between the second sub-clock signal line 322 and a corresponding first sub-circuit 312, or one to four columns of sub-pixels 2 may be disposed between the second sub-clock signal line 322 and the corresponding first sub-circuit 312. The distance d7 between the second sub-circuit 313 in the second shift register 31b and the fourth sub-clock signal line 324 is less than or equal to four times the first dimension value L. That is, in the first direction X, no sub-pixel 2 may be disposed between the fourth sub-clock signal line 324 and a corresponding second sub-circuit 313, or one to four columns of sub-pixels 2 may be disposed between the fourth sub-clock signal line 324 and the corresponding second sub-circuit 313.

In this way, the distance between the second sub-clock signal line 322 and the corresponding first sub-circuit 312 may be effectively reduced, and the parasitic capacitance and the resistance of the second sub-clock signal line 322 may be reduced, so that a severe attenuation of the clock signal in a process of transmitting in the second sub-clock signal line 322 is improved, and thus the display quality of the display panel 100 is improved. In this way, the distance between the fourth sub-clock signal line 324 and the corresponding second sub-circuit 313 may be effectively reduced, and the parasitic capacitance and the resistance of the fourth sub-clock signal line 324 may be reduced, so that a severe attenuation of the clock signal in a process of transmitting in the fourth sub-clock signal line 324 is improved, and thus the display quality of the display panel 100 is improved.

In some examples, in the case where the second sub-clock signal line 322 is electrically connected to the second sub-circuit 313 in the second shift register 31b, the fourth sub-clock signal line 324 is electrically connected to the first sub-circuit 312 in the second shift register 31b. The distance d3 between the second sub-circuit 313 in the second shift register 31b and the second sub-clock signal line 322 is less than or equal to four times the first dimension value L. That is, in the first direction X, no sub-pixel 2 may be disposed between the second sub-clock signal line 322 and a corresponding second sub-circuit 313, or one to four columns of sub-pixels 2 may be disposed between the second sub-clock signal line 322 and the corresponding second sub-circuit 313. The distance d9 between the first sub-circuit 312 in the second shift register 31b and the fourth sub-clock signal line 324 is less than or equal to four times the first dimension value L. That is, in the first direction X, no sub-pixel 2 may be disposed between the fourth sub-clock signal line 324 and a corresponding first sub-circuit 312, or one to four columns of sub-pixels 2 may be disposed between the fourth sub-clock signal line 324 and the corresponding first sub-circuit 312.

It will be noted that the display area A includes a plurality of first gap regions A1. The number of clock signal lines 32 is less than the number of first gap regions A1. Some first gap regions A1 are provided with clock signal lines 32 therein, and some other first gap regions A1 are not provided with clock signal lines 32 therein.

In some embodiments, as shown in FIGS. 7 and 8, the first gap region A1 where any one of the first sub-clock signal line 321 the second sub-clock signal line 322 is located is different from the first gap region A1 where any one of the third sub-clock signal line 323 and the fourth sub-clock signal line 324 is located.

That is, the first gap region A1 where the first sub-clock signal line 321 is located is different from the first gap region A1 where the third sub-clock signal line 323 is located. The first gap region A1 where the first sub-clock signal line 321 is located is different from the first gap region A1 where the fourth sub-clock signal line 324 is located. The first gap region A1 where the second sub-clock signal line 322 is located is different from the first gap region A1 where the third sub-clock signal line 323 is located. The first gap region A1 where the second sub-clock signal line 322 is located is different from the first gap region A1 where the fourth sub-clock signal line 324 is located.

That is, in the case where the first gap region A1 is provided with the clock signal line(s) 32 therein, there is one type of clock signal line 32 (e.g., the first sub-clock signal line 321, the second sub-clock signal line 322, the third sub-clock signal line 323 or the fourth sub-clock signal line 324).

In some examples, in the case where the first gap region A1 is provided with the clock signal line(s) 32 therein, only one clock signal line 32 is located in a same first gap region A1.

Here, the clock signal line 32 has a large dimension in the first direction X. Only one clock signal line 32 is disposed in the first gap region A1, so that a dimension of the first gap region A1 in the first direction X may be prevented from being increased, and thus dimensions of different first gap regions A1 in the first direction X may be prevented from being different, which is beneficial to make the plurality of sub-pixels 2 in the display panel 100 be uniformly distributed.

In some embodiments, the number of first sub-clock signal line(s) 321 may be determined according to a structure of a first transistor T1 in the first shift register 31a. The number of third sub-clock signal line(s) 323 may be determined according to a structure of a third transistor T3 in the first shift register 31a. The number of second sub-clock signal line(s) 322 may be determined according to a structure of a first transistor T1 or a third transistor T3 in the second shift register 31b. Accordingly, the number of fourth sub-clock signal line(s) 324 may be determined according to the structure of the third transistor T3 or the first transistor T1 in the second shift register 31b.

In the display process of the display panel 100, the first sub-clock signal line(s) 321 and the second sub-clock signal line(s) 322 transmit the same clock signal. A manner of transmitting the clock signal to the first sub-clock signal line(s) 321 and the second sub-clock signal line(s) 322 varies, and may be set according to actual needs.

In some examples, an end of the first sub-clock signal line(s) 321 and an end of the second sub-clock signal line(s) 322 may extend to the bezel area B, and be electrically connected to a port for providing a corresponding clock signal through corresponding signal transmission lines.

In some other examples, as shown in FIGS. 5 and 6, the scan driving circuit 3 further includes a first bus 33. The first bus 33 is electrically connected to the first sub-clock signal line(s) 321 and the second sub-clock signal line(s) 322. The first bus 33 is configured to transmit a corresponding clock signal to the first sub-clock signal line(s) 321 and the second sub-clock signal line(s) 322.

For example, a free end of the first bus 33 may be electrically connected to the port for providing the corresponding clock signal. In this way, the corresponding clock signal may be transmitted to the first sub-clock signal line(s) 321 and the second sub-clock signal line(s) 322 through the first bus 33, so that the first sub-clock signal line(s) 321 and the second sub-clock signal line(s) 322 are able to receive the corresponding clock signal synchronously.

The arrangement of the first bus 33 is beneficial to reducing the number of wires in the scan driving circuit 3, thereby simplifying the structure of the scan driving circuit 3 and reducing the occupied area of the scan driving circuit 3.

In addition, the plurality of clock signal lines 32 in the scan driving circuit 3 may further include the third sub-clock signal line(s) 323 and the fourth sub-clock signal line(s) 324. In the display process of the display panel 100, the third sub-clock signal line(s) 323 and the fourth sub-clock signal line(s) 324 transmit the same clock signal. A manner of transmitting the clock signal to the third sub-clock signal line(s) 323 and the fourth sub-clock signal line(s) 324 varies, and may be set according to actual needs.

In some examples, an end of the third sub-clock signal line(s) 323 and an end of the fourth sub-clock signal line(s) 324 may extend to the bezel area B, and be electrically connected to a port for providing a corresponding clock signal through corresponding signal transmission lines.

In some other examples, as shown in FIGS. 7 and 8, the scan driving circuit 3 further includes a second bus 34. The second bus 34 is electrically connected to the third sub-clock signal line(s) 323 and the fourth sub-clock signal line(s) 324. The second bus 34 is configured to transmit the corresponding clock signal to the third sub-clock signal line(s) 323 and the fourth sub-clock signal line(s) 324.

For example, a free end of the second bus 34 may be electrically connected to the port for providing the corresponding clock signal. In this way, the corresponding clock signal may be transmitted to the third sub-clock signal line(s) 323 and the fourth sub-clock signal line(s) 324 through the second bus 34, so that the third sub-clock signal line(s) 323 and the fourth sub-clock signal line(s) 324 are able to receive the corresponding clock signal synchronously.

The arrangement of the second bus 34 is beneficial to reducing the number of wires in the scan driving circuit 3, thereby simplifying the structure of the scan driving circuit 3 and reducing the occupied area of the scan driving circuit 3.

In some examples, as shown in FIGS. 7 and 8, the first bus 33 and the second bus 34 extend in the first direction X, and are located in the bezel area B.

The first bus 33 and the second bus 34 are arranged in the same direction, which is beneficial to reducing occupied areas of the first bus 33 and the second bus 34 in the display panel 100, and is further beneficial to reducing sizes of portions of the bezel area B located at other sides of the display area A without the first bus 33 and the second bus 34.

In some embodiments, the first electrode and the second electrode of the first transistor T1, the first electrode and the second electrode of the second transistor T2, and the first electrode and the second electrode of the third transistor T3 are arranged in a same layer. In a case where the scan driving circuit 3 further includes the first bus 33 and the second bus 34, the first bus 33, the second bus 34, the control electrode of the first transistor T1, the control electrode of the second transistor T2, the control electrode of the third transistor T3 and the first electrode of the first capacitor are arranged in a same layer.

Herein, the "same layer" means that a film layer for forming a specific pattern is formed by the same film forming process, and then is patterned by one patterning process using the same mask to form a layer structure. Depending on the different specific patterns, the same patterning process may include several exposure, development or etching processes, the specific patterns in the formed layer structure may be continuous or discontinuous, and these specific patterns may also be at different heights or have different thicknesses. In this way, the first electrode and the second electrode of the first transistor T1, the first electrode and the second electrode of the second transistor T2, and the first electrode and the second electrode of the third transistor T3 may be synchronously formed in one patterning process. The first bus 33, the second bus 34, the control electrode of the first transistor T1, the control electrode of the second transistor T2, the control electrode of the third transistor T3 and the first electrode of the first capacitor may be synchronously formed in one same patterning process. This is beneficial to simplifying the manufacturing process of the display panel 100.

In some embodiments, the first transistor T1 includes a plurality of first sub-transistors T11 connected in parallel, and/or the third transistor T3 includes a plurality of third sub-transistors T31 connected in parallel.

Based on this, arrangements of the structure of the first transistor T1 and the structure of the third transistor T3 may include as follows. The first transistor T1 includes the plurality of first sub-transistors T11 connected in parallel, and the third transistor T3 is a transistor with a complete structure, and is not divided into sub-transistors connected in parallel. Alternatively, the first transistor T1 is a transistor with a complete structure, and is not divided into sub-transistors connected in parallel, and the third transistor T3 includes the plurality of third sub-transistors T31 connected in parallel. Alternatively, the first transistor T1 includes the plurality of first sub-transistors T11 connected in parallel, and the third transistor T3 includes the plurality of third sub-transistors T31 connected in parallel.

In some examples, the first transistor T1 includes the plurality of first sub-transistors T11 connected in parallel.

For example, there are a plurality of first sub-clock signal lines 321. A first sub-transistor T11 in the first shift register 31a may be electrically connected to a first sub-clock signal line 321. Accordingly, a first sub-clock signal line 321 may be electrically connected to first sub-transistors T11, and the first sub-transistors T11 belong to different first shift registers 31a.

For example, the number of first sub-clock signal lines 321 may be equal to the number of the plurality of first sub-transistors T11 included in the first transistor T1 in the first shift register 31a.

For example, in the case where the second sub-clock signal line 322 is electrically connected to the first sub-circuit 312 in the second shift register 31b, there are a plurality of second sub-clock signal lines 322. A first sub-transistor T11 in the second shift register 31b may be electrically connected to a second sub-clock signal line 322. Accordingly, a second sub-clock signal line 322 may be electrically connected to first sub-transistors T11, and the first sub-transistors T11 belong to different second shift registers 31b.

For example, the number of second sub-clock signal lines 322 may be equal to the number of the plurality of first sub-transistors T11 included in the first transistor T1 in the second shift register 31b.

In some examples, the third transistor T3 includes the plurality of third sub-transistors T31 connected in parallel.

For example, in the case where the second sub-clock signal line 322 is electrically connected to the second sub-circuit 313 in the second shift register 31b, there are a plurality of second sub-clock signal lines 322. A third sub-transistor T31 in the second shift register 31b may be electrically connected to a second sub-clock signal line 322. Accordingly, a second sub-clock signal line 322 may be electrically connected to third sub-transistors T31, and the third sub-transistors T31 belong to different second shift registers 31b.

For example, the number of second sub-clock signal lines 322 may be equal to the number of the plurality of third sub-transistors T31 included in the third transistor T3 in the second shift register 31b.

Here, the plurality of first sub-clock signal lines 321 may be, for example, located in different first gap regions A1, and the plurality of second sub-clock signal lines 322 may be, for example, located in different first gap regions A1. This may ensure that in the case where the first gap region A1 is provided with the clock signal line(s) 32 therein, there is one clock signal line 32, so as to avoid affecting a uniformity of the sub-pixels 2, thereby ensuring the display effect of the display panel 100.

It will be noted that in the case where the plurality of clock signal lines 32 included in the scan driving circuit 3 further include the third sub-clock signal line(s) 323 and the fourth sub-clock signal line(s) 324, there are a plurality of third sub-clock signal lines 323, and there are a plurality of fourth sub-clock signal lines 324. Arrangements of the third sub-clock signal lines 323 and the fourth sub-clock signal lines 324 may refer to the arrangements of the first sub-clock signal lines 321 and the second sub-clock signal lines 322, and will not be repeated here.

In some embodiments, as shown in FIGS. 5 to 8, and FIGS. 11a and 11b, the display area A further includes a second gap region A2 located between any two adjacent rows of sub-pixels 2. The second gap region A2 extends in the first direction X.

An arrangement of the plurality of stages of shift registers 31 included in the scan driving circuit 3 in the display area A varies, and may be set according to actual needs.

In some examples, the transistors and the capacitor(s) in each stage of shift register 31 may be divided into a plurality of device groups, and each device group may be located between any two adjacent sub-pixels 2 in a corresponding row of sub-pixels 2.

In some other examples, as shown in FIGS. 5 to 8, and FIGS. 11a and 11b, each stage of shift register 31 may be located in a second gap region A2. That is, each stage of shift register 31 may be located between two adjacent rows of sub-pixels 2. In this case, the transistors and the capacitor(s) included in the shift register 31 may not be divided into groups.

Here, the number of shift registers 31 disposed in the second gap region A2 may be set according to actual needs.

For example, in a case where the number of shift registers 31 is greater than or equal to the number of rows of sub-pixels, each second gap region A2 may be provided with a shift register 31 therein. In this case, in the second direction Y, each row of sub-pixels 2 and each stage of shift register 31 are alternately arranged in sequence; or in a plurality of second gap regions A2, at least one second gap region A2 is not provided with shift registers 31 therein, and each of some other second gap regions A2 is provided with two shift registers 31 therein.

For example, in a case where the number of shift registers 31 is less than the number of rows of sub-pixels, in the plurality of second gap regions A2, at least one second gap region A2 is not provided with shift registers 31 therein, and each of some other second gap regions A2 is provided with a shift register 31 therein; or in the plurality of second gap regions A2, at least one second gap region A2 is not provided with shift registers 31 therein, and each of some other second gap regions A2 is provided with two shift registers 31 therein.

For example, as shown in FIGS. 11a and 11b, in an example where a stage of shift register 31 is electrically connected to a row of sub-pixels 2, in the second direction Y, two stages of shift registers 31 respectively electrically connected to any two adjacent rows of sub-pixels 2 are located in a second gap region A2 between the two adjacent rows of sub-pixels 2.

Four adjacent rows of sub-pixels 2 in the second direction Y are taken as an example.

The four rows of sub-pixels 2 may be referred to as a first row of sub-pixels, a second row of sub-pixels, a third row of sub-pixels and a fourth row of sub-pixels. A shift register 31 electrically connected to the first row of sub-pixels and a shift register 31 electrically connected to the second row of sub-pixels may be located in a second gap region A2 between the first row of sub-pixels and the second row of sub-pixels. A shift register 31 electrically connected to the third row of sub-pixels and a shift register 31 electrically connected to the fourth row of sub-pixels may be located in a second gap region A2 between the third row of sub-pixels and the fourth row of sub-pixels. A second gap region A2 between the second row of sub-pixels and the third row of sub-pixels is not provided with a shift register 31.

In some examples, as shown in FIGS. 11a and 11b, each sub-pixel 2 includes the pixel driving circuit 21 and the light-emitting device 22 that are arranged in the second direction Y. The pixel driving circuit 21 is electrically connected to the light-emitting device 22, and the pixel driving circuit 21 is configured to supply the driving voltage to the light-emitting device 22 to control the light-emitting state of the light-emitting device 22.

In a case where two stages of shift registers 31 respectively electrically connected to any two adjacent rows of sub-pixels 2 in the second direction Y are located in a second gap region A2 between the two adjacent rows of sub-pixels 2, in the two adjacent rows of sub-pixels 2, the light-emitting devices 22 are closer to the two stages of shift registers 31 than the pixel driving circuits 21. For example, the any two adjacent rows of sub-pixels 2 may be symmetrically arranged with respect to the second gap region A2 between the two adjacent rows of sub-pixels 2.

Three adjacent rows of sub-pixels 2 in the second direction Y are taken as an example. The three rows of sub-pixels 2 may be referred to as a first row of sub-pixels, a second row of sub-pixels and a third row of sub-pixels. A second gap region A2 between the first row of sub-pixels and the second row of sub-pixels is provided with two shift registers 31 therein, and a second gap region A2 between the second row of sub-pixels and the third row of sub-pixels is not provided with a shift register 31. In the first row of sub-pixels and the second row of sub-pixels, the light-emitting devices 22 are closer to the second gap region A2 between the first row of sub-pixels and the second row of sub-pixels than the pixel driving circuits 21. In the second row of sub-pixels and the third row of sub-pixels, the light-emitting devices 22 are farther from the second gap region A2 between the second row of sub-pixels and the third row of sub-pixels than the pixel driving circuits 21.

In this way, the light-emitting devices 22 in the plurality of sub-pixels 2 may be ensured to have a high distribution uniformity, thereby ensuring a good display effect of the display panel 100.

It will be noted that in these examples, only the arrangement positions of the pixel driving circuit 21 and the light-emitting device 22 in each sub-pixel 2 are limited, and whether the structure of the pixel driving circuit 21 and the structure of the light-emitting device 22 are symmetrical is not limited. The pixel driving circuit 21 and the light-emitting device 22 each include a plurality of film layers, and in a process of manufacturing the plurality of film layers, the film layers included in different pixel driving circuits 21 or the film layers included in different light-emitting devices 22 may have differences in size due to inevitable process errors and other reasons. Thus, the pixel driving circuits 21 in two adjacent rows of sub-pixels 2 cannot be strictly symmetrically arranged with respect to the second gap region A2 between the two adjacent rows of sub-pixels 2, and the light-emitting devices 22 in the two adjacent rows of sub-pixels 2 cannot be strictly symmetrically arranged with respect to the second gap region A2 between the two adjacent rows of sub-pixels 2.

Figure 10:
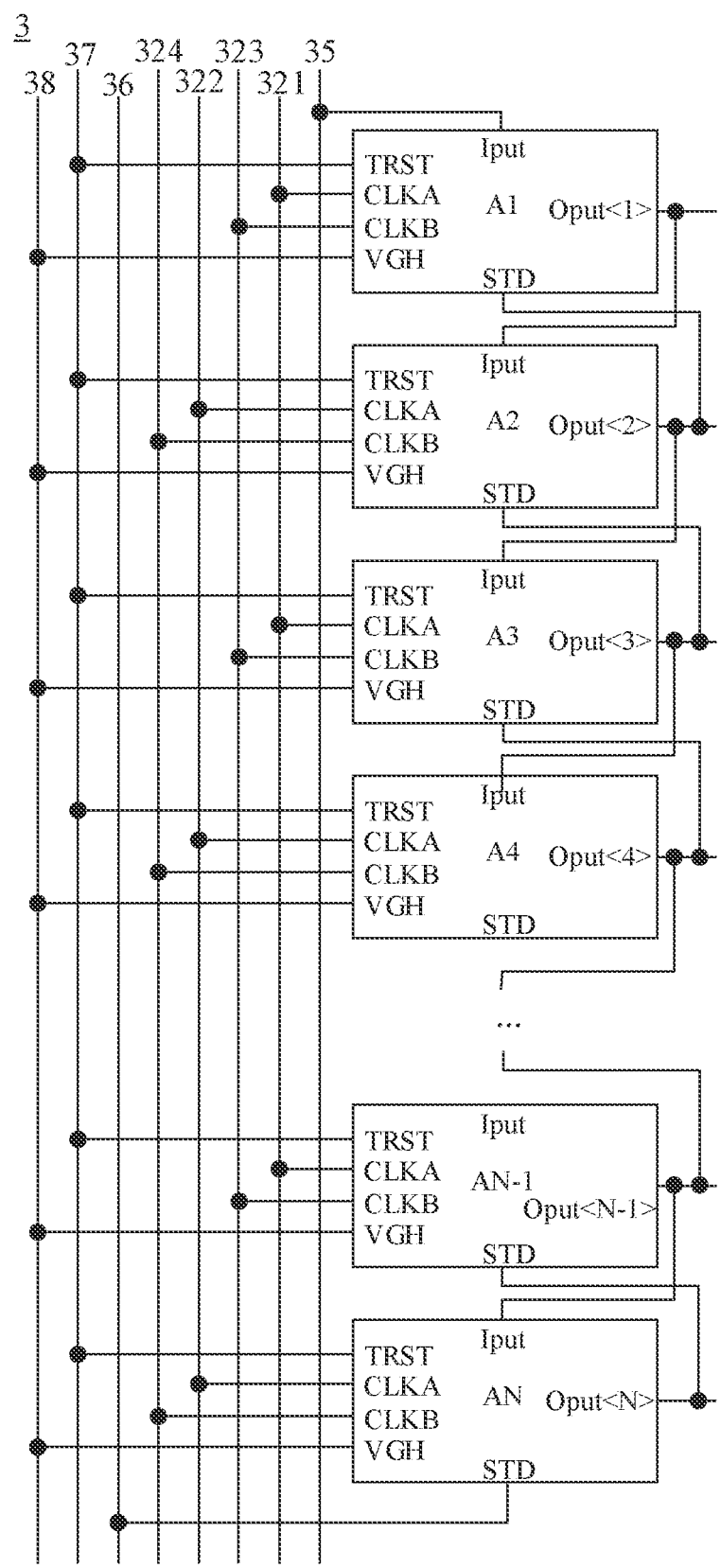
FIG. 10 is a structural diagram of a scan driving circuit, in accordance with some embodiments of the present disclosure.

In some embodiments, as shown in FIG. 10, the scan driving circuit 3 may further include the initial signal line 35, the display reset signal line 36, a global reset signal line 37 and a direct current voltage signal line 38. In FIG. 10, A1, A2, A3 ... AN are represent the first stage shift register 31, the second stage shift register 31, a third stage shift register 31 ... an N-th stage shift register 31, respectively.

For example, as shown in FIG. 10, after the plurality of stages of shift registers 31 are cascaded, an input signal terminal Iput<N> in the first shift register 31a may be electrically connected to the initial signal line 35 to receive the initial signal transmitted by the initial signal line 35 as the input signal.

For example, input signal terminal(s) Iput<N> in part (e.g., the second stage shift register 31) of the shift registers 31 except for the first stage shift register 31 are not respectively electrically connected to output signal terminal(s) Oput<N> in respective previous stage shift register(s) 31, and the input signal terminal(s) Iput<N> in the part of the shift registers 31 may be electrically connected to the initial signal line 35 to receive the initial signal transmitted by the initial signal line 35 as the input signal.

For example, as shown in FIG. 10, after the plurality of stages of shift registers 31 are cascaded, a display reset signal terminal STD in the last stage shift register 31 may be electrically connected to the display reset signal line 36 to receive the signal transmitted by the display reset signal line 36 as the display reset signal.

For example, display reset signal terminal(s) STD in part (e.g., the penultimate stage shift register 31) of the shift registers 31 except for the last stage shift register 31 are not respectively electrically connected to output signal terminal(s) Oput<N> in respective next stage shift register(s) 31, and the display reset signal terminal(s) STD in the part of the shift registers 31 may be electrically connected to the display reset signal line 36 to receive the signal transmitted by the display reset signal line 36 as the display reset signal.

For example, as shown in FIG. 10, a global reset signal terminal TRST in each stage of shift register 31 may be electrically connected to the global reset signal line 37 to receive a signal transmitted by the global reset signal line 37 as the global reset signal.

For example, as shown in FIG. 10, a second voltage signal terminal VGH in each stage of shift register 31 may be electrically connected to the direct current voltage signal line 38 to receive a direct current voltage signal transmitted by the direct current voltage signal line 38 as the second voltage signal.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display area, the display panel comprising:
   a plurality of sub-pixels located in the display area, wherein the plurality of sub-pixels are arranged in a plurality of rows in a second direction and arranged in a plurality of columns in a first direction, and the display area includes first gap regions each located between two adjacent columns of sub-pixels; and
   a scan driving circuit including a plurality of stages of shift registers and a plurality of clock signal lines that are all located in the display area, wherein the plurality of stages of shift registers include at least one first shift register and at least one second shift register, and the plurality of clock signal lines include at least one first sub-clock signal line and at least one second sub-clock signal line;
   wherein each shift register includes a first sub-circuit and a second sub-circuit;
   a first sub-clock signal line in the at least one first sub-clock signal line is electrically connected to a first sub-circuit in a first shift register in the at least one first shift register, and the first sub-clock signal line is located in a first gap region adjacent to the first sub-circuit in the first shift register;
   a second sub-clock signal line in the at least one second sub-clock signal line is electrically connected to one sub-circuit of a first sub-circuit and a second sub-circuit in a second shift register in the at least one second shift register, and the second sub-clock signal line is located in a first gap region adjacent to the one sub-circuit in the second shift register that is electrically connected to the second sub-clock signal line; and
   the first sub-clock signal line and the second sub-clock signal line are configured to transmit a same clock signal, and the first gap region where the first sub-clock signal line is located is different from the first gap region where the second sub-clock signal line is located;

wherein the second sub-clock signal line is electrically connected to the first sub-circuit in the second shift register, and a distance between the second sub-clock signal line and the first sub-circuit in the second shift register is less than a distance between the first sub-clock signal line and the first sub-circuit in the first shift register; or the second sub-clock signal line is electrically connected to the second sub-circuit in the second shift register, a distance between the second sub-clock signal line and the second sub-circuit in the second shift register is less than a distance between the second sub-clock signal line and the first sub-circuit in the first shift register, and a distance between the first sub-clock signal line and the first sub-circuit in the first shift register is less than or greater than a distance between the first sub-clock signal line and the second sub-circuit in the second shift register.

2. The display panel according to claim 1, wherein the second sub-clock signal line is electrically connected to the first sub-circuit in the second shift register; and the first sub-clock signal line is farther from the first sub-circuit in the first shift register and the first sub-circuit in the second shift register than the second sub-clock signal line; or the second sub-clock signal line is electrically connected to the second sub-circuit in the second shift register; and the first sub-clock signal line is located between the first sub-circuit in the first shift register and the second sub-circuit in the second shift register, and the second sub-clock signal line is farther from the first sub-clock signal line than the second sub-circuit in the second shift register.

3. The display panel according to claim 1, wherein the plurality of clock signal lines further include at least one third sub-clock signal line and at least one fourth sub-clock signal line;

a third sub-clock signal line in the at least one third sub-clock signal line is electrically connected to a second sub-circuit in the first shift register, and the third sub-clock signal line is located in a first gap region adjacent to the second sub-circuit in the first shift register;

a fourth sub-clock signal line in the at least one fourth sub-clock signal line is electrically connected to another sub-circuit of the first sub-circuit and the second sub-circuit in the second shift register, and the fourth sub-clock signal line is located in a first gap region adjacent to the another sub-circuit in the second shift register that is electrically connected to the fourth sub-clock signal line; and the third sub-clock signal line and the fourth sub-clock signal line are configured to transmit a same clock signal, and the first gap region where the third sub-clock signal line is located is different from the first gap region where the fourth sub-clock signal line is located.

4. The display panel according to claim 3, wherein the first gap region where any one of the third sub-clock signal line and the fourth sub-clock signal line is located is different from the first gap region where any one of the first sub-clock signal line and the second sub-clock signal line is located.

5. The display panel according to claim 3, wherein the second sub-clock signal line is electrically connected to the first sub-circuit in the second shift register; and the fourth sub-clock signal line is electrically connected to the second sub-circuit in the second shift register, and a distance between the fourth sub-clock signal line and the second sub-circuit in the second shift register is less than a distance between the third sub-clock signal line and the second sub-circuit in the first shift register; or the second sub-clock signal line is electrically connected to the second sub-circuit in the second shift register; and the fourth sub-clock signal line is electrically connected to the first sub-circuit in the second shift register, a distance between the third sub-clock signal line and the second sub-circuit in the first shift register is less than a distance between the third sub-clock signal line and the first sub-circuit in the second shift register, and a distance between the fourth sub-clock signal line and the first sub-circuit in the second shift register is less than a distance between the fourth sub-clock signal line and the second sub-circuit in the first shift register.

6. The display panel according to claim 5, wherein in a case where the second sub-clock signal line is electrically connected to the first sub-circuit in the second shift register, the third sub-clock signal line is farther from the second sub-circuit in the first shift register and the second sub-circuit in the second shift register than the fourth sub-clock signal line;

in a case where the second sub-clock signal line is electrically connected to the second sub-circuit in the second shift register, the fourth sub-clock signal line is located between the second sub-circuit in the first shift register and the first sub-circuit in the second shift register, and the third sub-clock signal line is farther from the fourth sub-clock signal line than the second sub-circuit in the first shift register.

7. The display panel according to claim 1, wherein a stage of shift register is electrically connected to a row of sub-pixels; and the at least one first shift register includes a plurality of first shift registers, and the at least one second shift register includes a plurality of second shift registers, wherein the plurality of first shift registers are electrically connected to odd-numbered rows of sub-pixels, and the plurality of second shift registers are electrically connected to even-numbered rows of sub-pixels.

8. The display panel according to claim 1, wherein the scan driving circuit further includes a first bus electrically connected to the first sub-clock signal line and the second sub-clock signal line and configured to transmit the clock signal to the first sub-clock signal line and the second sub-clock signal line; or the plurality of clock signal lines further include at least one third sub-clock signal line and at least one fourth sub-clock signal line, a third sub-clock signal line in the at least one third sub-clock signal line is electrically connected to a second sub-circuit in the first shift register, and the third sub-clock signal line is located in a first gap region adjacent to the second sub-circuit in the first shift register; a fourth sub-clock signal line in the at least one fourth sub-clock signal line is electrically connected to another sub-circuit of the first sub-circuit and the second sub-circuit in the second shift register, and the fourth sub-clock signal line is located in a first gap region adjacent to the another sub-circuit in the second shift register that is electrically connected to the fourth sub-clock signal line; the third sub-clock signal line and the fourth sub-clock signal line are configured to transmit a same clock signal, and the first gap region where the third sub-clock signal line is located is different from the first gap region where the fourth sub-clock signal line is located; and the scan driving circuit further includes a first bus electrically connected to the first sub-clock signal line and the second sub-clock signal line and configured to transmit the clock signal to the first sub-clock signal line and the second sub-clock signal line, and a second bus electrically connected to the third sub-clock signal line and the fourth sub-clock signal line and configured to transmit the clock signal to the third sub-clock signal line and the fourth sub-clock signal line.

9. The display panel according to claim 8, wherein the display panel further has a bezel area located on at least one side of the display area; and the first bus is located in the bezel area and extends in the first direction, or the first bus and the second bus are located in the bezel area and extend in the first direction.

10. The display panel according to claim 1, wherein the shift register further includes:

an input circuit electrically connected to an input signal terminal, a second voltage signal terminal and a pull-up node; the input circuit being configured to transmit a second voltage signal received at the second voltage signal terminal to the pull-up node in response to an input signal received at the input signal terminal;

a first reset circuit electrically connected to a pull-down node, the pull-up node and a first voltage signal terminal; the first reset circuit being configured to transmit a first voltage signal transmitted by the first voltage signal terminal to the pull-up node under a control of a voltage of the pull-down node, so as to reset the pull-up node;

a second reset circuit electrically connected to an output signal terminal, the pull-down node and the first voltage signal terminal; the second reset circuit being configured to transmit the first voltage signal transmitted by the first voltage signal terminal to the pull-down node under a control of an output signal transmitted by the output signal terminal, so as to reset the pull-down node;

a third reset circuit electrically connected to the pull-down node, the output signal terminal and the first voltage signal terminal; the third reset circuit being configured to transmit the first voltage signal transmitted by the first voltage signal terminal to the output signal terminal under the control of the voltage of the pull-down node, so as to reset the output signal terminal;

a fourth reset circuit electrically connected to a display reset signal terminal, the pull-up node and a third voltage signal terminal; the fourth reset circuit being configured to transmit a third voltage signal transmitted by the third voltage signal terminal to the pull-up node under a control of a display reset signal transmitted by the display reset signal terminal, so as to reset the pull-up node; and a fifth reset circuit electrically connected to a global reset signal terminal, the pull-up node and the first voltage signal terminal; the fifth reset circuit being configured to transmit the first voltage signal transmitted by the first voltage signal terminal to the pull-up node under a control of a global reset signal transmitted by the global reset signal terminal, so as to reset the pull-up node.

11. The display panel according to claim 10, wherein the input circuit includes a fourth transistor, wherein a control electrode of the fourth transistor is electrically connected to the input signal terminal, a first electrode of the fourth transistor is electrically connected to the second voltage signal terminal, and a second electrode of the fourth transistor is electrically connected to the pull-up node;

the first reset circuit includes a fifth transistor, wherein a control electrode of the fifth transistor is electrically connected to the pull-down node, a first electrode of the fifth transistor is electrically connected to the pull-up node, and a second electrode of the fifth transistor is electrically connected to the first voltage signal terminal;

the second reset circuit includes a sixth transistor, wherein a control electrode of the sixth transistor is electrically connected to the output signal terminal, a first electrode of the sixth transistor is electrically connected to the pull-down node, and a second electrode of the sixth transistor is electrically connected to the first voltage signal terminal;

the third reset circuit includes a seventh transistor and a second capacitor, wherein a control electrode of the seventh transistor is electrically connected to the pull-down node, a first electrode of the seventh transistor is electrically connected to the output signal terminal, and a second electrode of the seventh transistor is electrically connected to the first voltage signal terminal; and a first electrode of the second capacitor is electrically connected to the pull-down node, and a second electrode of the second capacitor is electrically connected to the first voltage signal terminal;

the fourth reset circuit includes an eighth transistor, wherein a control electrode of the eighth transistor is electrically connected to the display reset signal terminal, a first electrode of the eighth transistor is electrically connected to the pull-up node, and a second electrode of the eighth transistor is electrically connected to the third voltage signal terminal; and the fifth reset circuit includes a ninth transistor, wherein a control electrode of the ninth transistor is electrically connected to the global reset signal terminal, a first electrode of the ninth transistor is electrically connected to the pull-up node, and a second electrode of the ninth transistor is electrically connected to the first voltage signal terminal.

12. A display device comprising the display panel according to claim 1.

13. A display panel having a display area, the display panel comprising:

a plurality of sub-pixels located in the display area, wherein the plurality of sub-pixels are arranged in a plurality of rows in a second direction and arranged in a plurality of columns in a first direction, and the display area includes first gap regions each located between two adjacent columns of sub-pixels; and a scan driving circuit including a plurality of stages of shift registers and a plurality of clock signal lines that are all located in the display area, wherein the plurality of stages of shift registers include at least one first shift register and at least one second shift register, and the plurality of clock signal lines include at least one first sub-clock signal line and at least one second sub-clock signal line;

wherein each shift register includes a first sub-circuit and a second sub-circuit;

a first sub-clock signal line in the at least one first sub-clock signal line is electrically connected to a first sub-circuit in a first shift register in the at least one first shift register, and the first sub-clock signal line is located in a first gap region adjacent to the first sub-circuit in the first shift register;

a second sub-clock signal line in the at least one second sub-clock signal line is electrically connected to one sub-circuit of a first sub-circuit and a second sub-circuit in a second shift register in the at least one second shift register, and the second sub-clock signal line is located in a first gap region adjacent to the one sub-circuit in the second shift register that is electrically connected to the second sub-clock signal line; and the first sub-clock signal line and the second sub-clock signal line are configured to transmit a same clock signal, and the first gap region where the first sub-clock signal line is located is different from the first gap region where the second sub-clock signal line is located;

wherein in each shift register, the first sub-circuit is electrically connected to a first clock signal terminal, a pull-up node, a pull-down node and a first voltage signal terminal; the first sub-circuit is configured to: under a control of a first clock signal transmitted by the first clock signal terminal, transmit the first clock signal to the pull-down node; and control a voltage of the pull-down node under a control of a voltage of the pull-up node; and the second sub-circuit is electrically connected to a second clock signal terminal, the pull-up node and an output signal terminal; the second sub-circuit is configured to transmit a second clock signal received at the second clock signal terminal to the output signal terminal under the control of the voltage of the pull-up node; wherein the first sub-clock signal line is electrically connected to the first sub-circuit in the first shift register through a first clock signal terminal; and the second sub-clock signal line is electrically connected to the first sub-circuit in the second shift register through a first clock signal terminal; or the second sub-clock signal line is electrically connected to the second sub-circuit in the second shift register through a second clock signal terminal; or the plurality of clock signal lines further include at least one third sub-clock signal line and at least one fourth sub-clock signal line; the first sub-clock signal line is electrically connected to the first sub-circuit in the first shift register through a first clock signal terminal; and a third sub-clock signal line in the at least one third sub-clock signal line is electrically connected to a second sub-circuit in the first shift register through a second clock signal terminal, and the third sub-clock signal line is located in a first gap region adjacent to the second sub-circuit in the first shift register; and the second sub-clock signal line is electrically connected to the first sub-circuit in the second shift register through a first clock signal terminal, and a fourth sub-clock signal line in the at least one fourth sub-clock signal line is electrically connected to the second sub-circuit in the second shift register through a second clock signal terminal, and the fourth sub-clock signal line is located in a first gap region adjacent to the second sub-circuit in the second shift register that is electrically connected to the fourth sub-clock signal line; or the second sub-clock signal line is electrically connected to the second sub-circuit in the second shift register through a second clock signal terminal, and the fourth sub-clock signal line is electrically connected to the first sub-circuit in the second shift register through a first clock signal terminal, and the fourth sub-clock signal line is located in a first gap region adjacent to the first sub-circuit in the second shift register that is electrically connected to the fourth sub-clock signal line.

14. The display panel according to claim 13, wherein the first sub-circuit includes a first transistor and a second transistor, wherein a control electrode of the first transistor is electrically connected to the first clock signal terminal, a first electrode of the first transistor is electrically connected to the first clock signal terminal, and a second electrode of the first transistor is electrically connected to the pull-down node; and a control electrode of the second transistor is electrically connected to the pull-up node, a first electrode of the second transistor is electrically connected to the pull-down node, and a second electrode of the second transistor is electrically connected to the first voltage signal terminal; and the second sub-circuit includes a third transistor and a first capacitor, wherein a control electrode of the third transistor is electrically connected to the pull-up node, a first electrode of the third transistor is electrically connected to the second clock signal terminal, and a second electrode of the third transistor is electrically connected to the output signal terminal; and a first electrode of the first capacitor is electrically connected to the pull-up node, and a second electrode of the first capacitor is electrically connected to the output signal terminal;

wherein the first sub-clock signal line is electrically connected to the first transistor in the first shift register; and the second sub-clock signal line is electrically connected to the first transistor in the second shift register; or the second sub-clock signal line is electrically connected to the third transistor in the second shift register;

in a case where the plurality of clock signal lines further include the at least one third sub-clock signal line and the at least one fourth sub-clock signal line, the third sub-clock signal line is electrically connected to the third transistor in the first shift register; and the second sub-clock signal line is electrically connected to the first transistor in the second shift register, and the fourth sub-clock signal line is electrically connected to the third transistor in the second shift register; or the second sub-clock signal line is electrically connected to the third transistor in the second shift register, and the fourth sub-clock signal line is electrically connected to the first transistor in the second shift register.

15. The display panel according to claim 14, wherein the first transistor includes a plurality of first sub-transistors connected in parallel; and/or the third transistor includes a plurality of third sub-transistors connected in parallel; and the at least one first sub-clock signal line includes a plurality of first sub-clock signal lines; and a first sub-transistor in the first shift register is electrically connected to a first sub-clock signal line;

in a case where the at least one second sub-clock signal line includes a plurality of second sub-clock signal lines, the plurality of second sub-clock signal lines are electrically connected to the first sub-circuit in the second shift register; and a first sub-transistor in the second shift register is electrically connected to a second sub-clock signal line;

in a case where the at least one second sub-clock signal line includes a plurality of second sub-clock signal lines, the plurality of second sub-clock signal lines are electrically connected to the second sub-circuit in the second shift register; and a third sub-transistor in the second shift register is electrically connected to a second sub-clock signal line.

16. The display panel according to claim 15, wherein first gap regions where the plurality of first sub-clock signal lines are located are different; and first gap regions where the plurality of second sub-clock signal lines are located are different.

17. The display panel according to claim 14, wherein the plurality of clock signal lines, the first electrode and the second electrode of the first transistor, the first electrode and the second electrode of the second transistor, and the first electrode and the second electrode of the third transistor are arranged in a same layer; or the plurality of clock signal lines, the first electrode and the second electrode of the first transistor, the first electrode and the second electrode of the second transistor, and the first electrode and the second electrode of the third transistor are arranged in a same layer; and the plurality of clock signal lines further include the at least one third sub-clock signal line and the at least one fourth sub-clock signal line; the scan driving circuit further includes a first bus and a second bus, the first bus is electrically connected to the first sub-clock signal line and the second sub-clock signal line and configured to transmit a corresponding clock signal to the first sub-clock signal line and the second sub-clock signal line, and the second bus is electrically connected to the third sub-clock signal line and the fourth sub-clock signal line and configured to transmit a corresponding clock signal to the third sub-clock signal line and the fourth sub-clock signal line; the first bus, the second bus, the control electrode of the first transistor, the control electrode of the second transistor, the control electrode of the third transistor and the first electrode of the first capacitor are arranged in a same layer.

18. The display panel according to claim 1, wherein the display area further includes second gap regions each located between two adjacent rows of sub-pixels; and the shift registers are located in the second gap regions.

19. The display panel according to claim 18, wherein at least one shift register electrically connected to any two adjacent rows of sub-pixels in the second direction is located in a second gap region between the two adjacent rows of sub-pixels; or at least one shift register electrically connected to any two adjacent rows of sub-pixels in the second direction is located in a second gap region between the two adjacent rows of sub-pixels; each sub-pixel includes a pixel driving circuit and a light-emitting device that are arranged in the second direction; and the at least one shift register includes two stages of shift registers, and in the two adjacent rows of sub-pixels, light-emitting devices are closer to the two stages of shift registers than pixel driving circuits.

20. A display panel having a display area, the display panel comprising:

a plurality of sub-pixels located in the display area, wherein the plurality of sub-pixels are arranged in a plurality of rows in a second direction and arranged in a plurality of columns in a first direction, and the display area includes first gap regions each located between two adjacent columns of sub-pixels; and a scan driving circuit including a plurality of stages of shift registers and a plurality of clock signal lines that are all located in the display area, wherein the plurality of stages of shift registers include at least one first shift register and at least one second shift register, and the plurality of clock signal lines include at least one first sub-clock signal line and at least one second sub-clock signal line;

wherein each shift register includes a first sub-circuit and a second sub-circuit;

a first sub-clock signal line in the at least one first sub-clock signal line is electrically connected to a first sub-circuit in a first shift register in the at least one first shift register, and the first sub-clock signal line is located in a first gap region adjacent to the first sub-circuit in the first shift register;

a second sub-clock signal line in the at least one second sub-clock signal line is electrically connected to one sub-circuit of a first sub-circuit and a second sub-circuit in a second shift register in the at least one second shift register, and the second sub-clock signal line is located in a first gap region adjacent to the one sub-circuit in the second shift register that is electrically connected to the second sub-clock signal line; and the first sub-clock signal line and the second sub-clock signal line are configured to transmit a same clock signal, and the first gap region where the first sub-clock signal line is located is different from the first gap region where the second sub-clock signal line is located, wherein the scan driving circuit further includes a first bus electrically connected to the first sub-clock signal line and the second sub-clock signal line and configured to transmit the clock signal to the first sub-clock signal line and the second sub-clock signal line; or the plurality of clock signal lines further include at least one third sub-clock signal line and at least one fourth sub-clock signal line, a third sub-clock signal line in the at least one third sub-clock signal line is electrically connected to a second sub-circuit in the first shift register, and the third sub-clock signal line is located in a first gap region adjacent to the second sub-circuit in the first shift register; a fourth sub-clock signal line in the at least one fourth sub-clock signal line is electrically connected to another sub-circuit of the first sub-circuit and the second sub-circuit in the second shift register, and the fourth sub-clock signal line is located in a first gap region adjacent to the another sub-circuit in the second shift register that is electrically connected to the fourth sub-clock signal line; the third sub-clock signal line and the fourth sub-clock signal line are configured to transmit a same clock signal, and the first gap region where the third sub-clock signal line is located is different from the first gap region where the fourth sub-clock signal line is located; and the scan driving circuit further includes a first bus electrically connected to the first sub-clock signal line and the second sub-clock signal line and configured to transmit the clock signal to the first sub-clock signal line and the second sub-clock signal line, and a second bus electrically connected to the third sub-clock signal line and the fourth sub-clock signal line and configured to transmit the clock signal to the third sub-clock signal line and the fourth sub-clock signal line.

\* \* \* \* \*